(12) United States Patent
Tawaragi et al.

(10) Patent No.: US 12,388,348 B2
(45) Date of Patent: Aug. 12, 2025

(54) POWER CONVERSION DEVICE AND CONTROL METHOD

(71) Applicant: OMRON Corporation, Kyoto (JP)

(72) Inventors: Takayoshi Tawaragi, Kyoto (JP); Takanori Ishii, Kyoto (JP); Aya Murata, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 203 days.

(21) Appl. No.: 18/263,167

(22) PCT Filed: Dec. 20, 2021

(86) PCT No.: PCT/JP2021/047137
§ 371 (c)(1),
(2) Date: Jul. 27, 2023

(87) PCT Pub. No.: WO2022/176373
PCT Pub. Date: Aug. 25, 2022

(65) Prior Publication Data
US 2024/0088778 A1 Mar. 14, 2024

(30) Foreign Application Priority Data
Feb. 16, 2021 (JP) ................................ 2021-022699

(51) Int. Cl.
*H02M 1/00* (2007.01)
*H02M 1/08* (2006.01)
(Continued)

(52) U.S. Cl.
CPC ....... *H02M 1/0095* (2021.05); *H02M 1/0029* (2021.05); *H02M 1/08* (2013.01);
(Continued)

(58) Field of Classification Search
CPC .... H02M 1/0029; H02M 1/0095; H02M 1/08; H02M 7/487; H02M 7/4837
See application file for complete search history.

(56) References Cited

U.S. PATENT DOCUMENTS

| 9,906,166 B2 | 2/2018 | Xu et al. |
| 2013/0176014 A1 | 7/2013 | Guan et al. |

(Continued)

FOREIGN PATENT DOCUMENTS

| CN | 104601026 A | 5/2015 |
| CN | 108809133 B | 8/2020 |

(Continued)

OTHER PUBLICATIONS

Extended European Search Report dated Nov. 12, 2024, issued in European Patent Application No. 201926796.0.
(Continued)

*Primary Examiner* — Jue Zhang
(74) *Attorney, Agent, or Firm* — ROSSI, KIMMS & McDOWELL LLP

(57) ABSTRACT

A controller in a power conversion unit increases or decreases, based on a detected voltage value of a first flying capacitor, a value of a gate voltage to be applied to a gate terminal of a target switch to be controlled selectively from first to fourth switches in a first capacitor circuit to cause conduction between a drain terminal and a source terminal of the target switch, or changes a gradient of the gate voltage value. The controller increases or decreases, based on a detected voltage value of the second flying capacitor, a value of a gate voltage to be applied to a gate terminal of a target switch to be controlled selectively from fifth to eighth switches in a second capacitor circuit to cause conduction between a drain terminal and a source terminal of the target switch, or changes a gradient of the gate voltage value.

10 Claims, 10 Drawing Sheets

(51) Int. Cl.
H02M 7/483 (2007.01)
H02M 7/487 (2007.01)

(52) U.S. Cl.
CPC ....... *H02M 7/4833* (2021.05); *H02M 7/4837* (2021.05); *H02M 7/487* (2013.01)

(56) References Cited

U.S. PATENT DOCUMENTS

| | | | |
|---|---|---|---|
| 2015/0155770 A1* | 6/2015 | Ying | H02M 1/08 307/52 |
| 2015/0311776 A1* | 10/2015 | Lavieville | H02M 7/4837 363/65 |
| 2016/0352251 A1 | 12/2016 | Li et al. | |
| 2017/0331374 A1* | 11/2017 | Høyerby | H03F 3/183 |
| 2018/0152184 A1 | 5/2018 | Voltti | |
| 2018/0183333 A1* | 6/2018 | Uenaka | H02M 1/38 |
| 2019/0006934 A1 | 1/2019 | Nakashima et al. | |
| 2019/0363644 A1 | 11/2019 | Li et al. | |

FOREIGN PATENT DOCUMENTS

| | | |
|---|---|---|
| EP | 3179632 A1 | 6/2017 |
| JP | 2012210066 A | 10/2012 |
| JP | 2013533729 A | 8/2013 |
| JP | 2019057969 A | 4/2019 |
| WO | 2017037916 A1 | 3/2017 |

OTHER PUBLICATIONS

Zhao Shuang et al: "A Review of Switching Slew Rate Control for Silicon Carbide Devices Using Active Gate Drivers", IEEE Journal of Emerging and Selected Topics in Power Electronics, vol. 9, No. 4, Aug. 2021, pp. 4096-4114.

Jose I Leon et al: "Simple Modulator with Voltage Balancing Control for the Hybrid Five-Level Flying-Capacitor Based ANPC Converter", IEEE, 2011, pp. 1887-1892.

Tian Hao et al: "An Active Capacitor Voltage Balancing Method for Seven-Level Hybrid Clamped (7L-HC) Converter in Motor Drives", IEEE Transactions on Power Electronics, vol. 35, No. 3, Mar. 2020, pp. 2372-2388.

International Search Report issued in Intl. Appln. No. PCT/JP2021/047137 mailed Mar. 1, 2022. English translation provided.

Written Opinion issued in Intl. Appln. No. PCT/JP2021/047137 mailed Mar. 1, 2022. English translation provided.

Geyer et al. "Model Predictive Direct Torque Control of a Five-Level ANPC Converter Drive System". 2011 IEEE Energy Conversion Congress and Exposition. Nov. 1, 2011: 363-370. Cited in NPL1 and NPL2.

Geyer et al. "Model Predictive Direct Torque Control of a Five-Level ANPC Converter Drive System". IEEE Transactions on Industry Applications. Sep./Oct. 2012: 1565-1575. vol. 48, No. 5.

* cited by examiner (1) Output voltage (2) Example pattern for outputting 2E

| | f c 1 | f c 2 | d c 1 | d c 2 |
|---|---|---|---|---|
| A | Charging | Discharging | Discharging | Charging |
| B | Discharging | Charging | Charging | Discharging |
| C | Discharging | Charging | Discharging | Charging |
| D | Charging | Discharging | Charging | Discharging |

Tb1

When patterns A to D have same switching time, four voltages are constant.

Switching times differ due to parameter variations among components.

(1)

Before control (2)

After control

POWER CONVERSION DEVICE AND CONTROL METHOD

FIELD

The present invention relates to a multilevel power converter including flying capacitors and to a control method.

BACKGROUND

Distributed power supply systems have been widespread in recent years. A distributed power supply system includes, for example, photovoltaic power generators, rechargeable batteries, or fuel cells, and operates together with the interconnected power grid. The distributed power supply system includes power conditioners (hereafter also referred to as power converters) that convert direct current (DC) power obtained with, for example, photovoltaic power generators, rechargeable batteries, or fuel cells to alternating current (AC) power before supplying power to loads and to the interconnected power grid. As such power converters, for example, Patent Literature 1 describes multilevel power convertors that output voltages at multiple levels with flying capacitors.

CITATION LIST

Patent Literature

Patent Literature 1: Japanese Unexamined Patent Application Publication No. 2019-57969

SUMMARY

Technical Problem

A multilevel power converter includes flying capacitors having constantly balanced voltages under an ideal condition in which the components of the circuit have no parameter variations. However, the components of the circuit with parameter variations can cause fluctuations in the voltage values of the flying capacitors.

In response to the above circumstances, one or more aspects of the present invention are directed to a technique for reducing voltage fluctuations resulting from parameter variations among components and improving stability in a multilevel power converter including flying capacitors.

Solution to Problem

A power converter according to one aspect of the present disclosure includes a controller and a power conversion unit. The power conversion unit causes, based on a control command from the controller, conduction or opening between a drain terminal and a source terminal of each of a plurality of switches and converts direct current power input into a first input terminal and a second input terminal to alternating current power to output the alternating current power from a first output terminal and a second output terminal.

The power conversion unit includes a direct current capacitor circuit, a first capacitor circuit, a second capacitor circuit, a first output circuit, and a second output circuit.

The direct current capacitor circuit includes a first direct current capacitor and a second direct current capacitor connected in series between the first input terminal and the second input terminal. The first direct current capacitor has an end connected to the first input terminal. The second direct current capacitor has an end connected to the second input terminal.

The first capacitor circuit includes a first switch, a second switch, a third switch, and a fourth switch connected in series. The first capacitor circuit includes a first flying capacitor having one end connected to a node between the source terminal of the first switch and the drain terminal of the second switch and another end connected to a node between the source terminal of the third switch and the drain terminal of the fourth switch. The first capacitor circuit includes a node between the source terminal of the second switch and the drain terminal of the third switch connected to the second output terminal.

The second capacitor circuit includes a fifth switch, a sixth switch, a seventh switch, and an eighth switch connected in series. The second capacitor circuit includes a second flying capacitor having one end connected to a node between the source terminal of the fifth switch and the drain terminal of the sixth switch and another end connected to a node between the source terminal of the seventh switch and the drain terminal of the eighth switch. The second capacitor circuit includes a node between the source terminal of the sixth switch and the drain terminal of the seventh switch connected to the first output terminal.

The first output circuit includes a ninth switch, a tenth switch, an eleventh switch, and a twelfth switch connected in series between the first input terminal and the second input terminal. The ninth switch includes the drain terminal connected to the first input terminal. The twelfth switch includes the source terminal connected to the second input terminal.

The second output circuit includes a thirteenth switch, a fourteenth switch, a fifteenth switch, and a sixteenth switch connected in series between the first input terminal and the second input terminal. The thirteenth switch includes the drain terminal connected to the first input terminal. The sixteenth switch includes the source terminal connected to the second input terminal.

The first output circuit includes a node between the source terminal of the ninth switch and the drain terminal of the tenth switch connected to the drain terminal of the first switch in the first capacitor circuit, a node between the source terminal of the eleventh switch and the drain terminal of the twelfth switch connected to the source terminal of the fourth switch in the first capacitor circuit, and a node between the source terminal of the tenth switch and the drain terminal of the eleventh switch connected to a node between the first direct current capacitor and the second direct current capacitor in the direct current capacitor circuit.

The second output circuit includes a node between the source terminal of the thirteenth switch and the drain terminal of the fourteenth switch connected to the drain terminal of the fifth switch in the second capacitor circuit, a node between the source terminal of the fifteenth switch and the drain terminal of the sixteenth switch connected to the source terminal of the eighth switch in the second capacitor circuit, and a node between the source terminal of the fourteenth switch and the drain terminal of the fifteenth switch connected to the node between the first direct current capacitor and the second direct current capacitor in the direct current capacitor circuit.

The controller increases or decreases, based on a detected voltage value of the first flying capacitor, a value of a gate voltage to be applied to a gate terminal of a target switch to be controlled selectively from the first switch, the second switch, the third switch, and the fourth switch in the first capacitor circuit to cause conduction between the drain terminal and the source terminal of the target switch, or changes a gradient of the value of the gate voltage based on the detected voltage value of the first flying capacitor.

The controller increases or decreases, based on a detected voltage value of the second flying capacitor, a value of a gate voltage to be applied to a gate terminal of a target switch to be controlled selectively from the fifth switch, the sixth switch, the seventh switch, and the eighth switch in the second capacitor circuit to cause conduction between the drain terminal and the source terminal of the target switch, or changes a gradient of the value of the gate voltage based on the detected voltage value of the second flying capacitor.

The power converter with the above structure can relatively increase or decrease a transition time (slew rate) from the off-state to the on-state of each switch for charging and discharging the first flying capacitor circuit 12 and the second flying capacitor circuit 13 based on the detected voltage value (FC1) of the flying capacitor fc1 and the detected voltage value (FC2) of the flying capacitor fc2. The power converter can adjust a difference in switching time for charging and discharging resulting from parameter variations among components by controlling the gate voltage value for each switch included in the first flying capacitor circuit 12 and the second flying capacitor circuit 13. The power converter can thus reduce voltage fluctuations resulting from parameter variations among components and improve stability in the multilevel power conversion unit 10 including the flying capacitors.

In one aspect of present disclosure, the controller may increase a value of a gate voltage to be applied to a gate terminal of each of the second switch (S1) and the first switch (S3) in the first capacitor circuit to cause conduction between the drain terminal and the source terminal of each of the second switch (S1) and the first switch (S3) or increase a gradient of the value of the gate voltage in response to the detected voltage value of the first flying capacitor being greater than a first voltage value and the alternating current power having a current value greater than a predetermined value. This structure increases the gate voltage values to be applied to the gate terminals of the switch S1 and the switch S3 or increases the gradients of the gate voltage values in response to the voltage value of the flying capacitor fc1 being greater than a constant value (E) and the current flowing through a current path from the power conversion unit 10 to a load 50. The structure can thus relatively decrease the transition time (increase the slew rate) of the switch S1 and the switch S3 from the off-state to the on-state and adjust the length of the discharging period of the flying capacitor fc1.

In one aspect of present disclosure, the controller may increase a value of a gate voltage to be applied to a gate terminal of each of the third switch (S2) and the fourth switch (S4) in the first capacitor circuit to cause conduction between the drain terminal and the source terminal of each of the third switch (S2) and the fourth switch (S4) or increase a gradient of the value of the gate voltage in response to the detected voltage value of the first flying capacitor being greater than a first voltage value and the alternating current power having a current value less than or equal to a predetermined value. This structure can increase the gate voltage values to be applied to the gate terminals of the switch S2 and the switch S4 or increase the gradients of the gate voltage values in response to the voltage value of the flying capacitor fc1 being greater than the constant value (E) and the current flowing through a current path from the load 50 to the power conversion unit 10. The structure can thus relatively decrease the transition time of each of the switch S2 and the switch S4 from the off-state to the on-state and adjust the length of the discharging period of the flying capacitor fc1.

In one aspect of present disclosure, the controller may decrease a value of a gate voltage to be applied to a gate terminal of each of the second switch (S1) and the first switch (S3) in the first capacitor circuit to cause conduction between the drain terminal and the source terminal of each of the second switch (S1) and the first switch (S3) or decrease a gradient of the value of the gate voltage in response to the detected voltage value of the first flying capacitor being less than or equal to a first voltage value and the alternating current power having a current value greater than a predetermined value. This structure can decrease the gate voltage values to be applied to the gate terminals of the switch S1 and the switch S3 or decrease the gradients of the gate voltage values in response to the voltage value of the flying capacitor fc1 being greater than the constant value (E) and the current flowing through a current path from the power conversion unit 10 to the load 50. The structure can thus relatively increase the transition time of each of the switch S1 and the switch S3 from the off-state to the on-state and adjust the length of the charging period of the flying capacitor fc1.

In one aspect of present disclosure, the controller may decrease a value of a gate voltage to be applied to a gate terminal of each of the third switch (S2) and the fourth switch (S4) in the first capacitor circuit to cause conduction between the drain terminal and the source terminal of each of the third switch (S2) and the fourth switch (S4) or decrease a gradient of the value of the gate voltage in response to the detected voltage value of the first flying capacitor being less than or equal to a first voltage value and the alternating current power having a current value less than or equal to a predetermined value. This structure can decrease the gate voltage values to be applied to the gate terminals of the switch S2 and the switch S4 or decrease the gradients of the gate voltage values in response to the voltage value of the flying capacitor fc1 being less than or equal to the constant value (E) and the current flowing through a current path from the load 50 to the power conversion unit 10. The structure can thus relatively increase the transition time of each of the switch S2 and the switch S4 from the off-state to the on-state and adjust the length of the discharging period of the flying capacitor fc1.

In one aspect of present disclosure, the controller may increase a value of a gate voltage to be applied to a gate terminal of each of the sixth switch (S9) and the fifth switch (S11) in the second capacitor circuit to cause conduction between the drain terminal and the source terminal of each of the sixth switch (S9) and the fifth switch (S11) or increase a gradient of the value of the gate voltage in response to the detected voltage value of the second flying capacitor being greater than a first voltage value and the alternating current power having a current value greater than a predetermined value. This structure can increase the gate voltage values to be applied to the gate terminals of the switch S9 and the switch S11 or increase the gradients of the gate voltage values in response to the voltage value of the flying capacitor fc2 being greater than the constant value (E) and the current flowing through a current path from the power conversion unit 10 to the load 50. The structure can thus relatively decrease the transition time of each of the switch S9 and the switch S11 from the off-state to the on-state and adjust the length of the charging period of the flying capacitor fc2.

In one aspect of present disclosure, the controller may increase a value of a gate voltage to be applied to a gate terminal of each of the seventh switch (S10) and the eighth switch (S12) in the second capacitor circuit to cause conduction between the drain terminal and the source terminal of each of the seventh switch (S10) and the eighth switch (S12) or increase a gradient of the value of the gate voltage in response to the detected voltage value of the second flying capacitor being greater than a first voltage value and the alternating current power having a current value less than or equal to a predetermined value. This structure can increase the gate voltage values to be applied to the gate terminals of the switch S10 and the switch S12 or increase the gradients of the gate voltage values in response to the voltage value of the flying capacitor fc2 being greater than the constant value (E) and the current flowing through a current path from the load 50 to the power conversion unit 10. The structure can thus relatively decrease the transition time of each of the switch S10 and the switch S12 from the off-state to the on-state and adjust the length of the discharging period of the flying capacitor fc2.

In one aspect of present disclosure, the controller may decrease a value of a gate voltage to be applied to a gate terminal of each of the sixth switch (S9) and the fifth switch (S11) in the second capacitor circuit to cause conduction between the drain terminal and the source terminal of each of the sixth switch (S9) and the fifth switch (S11) or decrease a gradient of the value of the gate voltage in response to the detected voltage value of the second flying capacitor being less than or equal to a first voltage value and the alternating current power having a current value greater than a predetermined value. This structure can decrease the gate voltage values to be applied to the gate terminals of the switch S9 and the switch S11 or decrease the gradients of the gate voltage values in response to the voltage value of the flying capacitor fc2 being less than or equal to the constant value (E) and the current flowing through a current path from the power conversion unit 10 to the load 50. The structure can thus relatively increase the transition time of each of the switch S9 and the switch S11 from the off-state to the on-state and adjust the length of the discharging period of the flying capacitor fc2.

In one aspect of present disclosure, the controller may decrease a value of a gate voltage to be applied to a gate terminal of each of the seventh switch S10 and the eighth switch (S12) in the second capacitor circuit to cause conduction between the drain terminal and the source terminal of each of the seventh switch (S10) and the eighth switch (S12) or decrease a gradient of the value of the gate voltage in response to the detected voltage value of the second flying capacitor being less than or equal to a first voltage value and the alternating current power having a current value less than or equal to a predetermined value. This structure can decrease the gate voltage values to be applied to the gate terminals of the switch S10 and the switch S12 or decrease the gradients of the gate voltage values in response to the voltage value of the flying capacitor fc2 being less than or equal to the constant value (E) and the current flowing through a current path from the load 50 to the power conversion unit 10. The structure can thus relatively increase the transition time (decrease the slew rate) of the switch S10 and the switch S12 from the off-state to the on-state and adjust the length of the charging period of the flying capacitor fc2.

A control method according to another aspect of the present disclosure is a method for controlling a power converter.

The power converter includes a controller and a power conversion unit. The power conversion unit causes, based on a control command from the controller, conduction or opening between a drain terminal and a source terminal of each of a plurality of switches and converts direct current power input into a first input terminal and a second input terminal to alternating current power to output the alternating current power from a first output terminal and a second output terminal.

The power conversion unit includes a direct current capacitor circuit, a first capacitor circuit, a second capacitor circuit, a first output circuit, and a second output circuit.

The direct current capacitor circuit includes a first direct current capacitor and a second direct current capacitor connected in series between the first input terminal and the second input terminal. The first direct current capacitor has an end connected to the first input terminal. The second direct current capacitor has an end connected to the second input terminal.

The first capacitor circuit includes a first switch, a second switch, a third switch, and a fourth switch connected in series. The first capacitor circuit includes a first flying capacitor having one end connected to a node between the source terminal of the first switch and the drain terminal of the second switch and another end connected to a node between the source terminal of the third switch and the drain terminal of the fourth switch. The first capacitor circuit includes a node between the source terminal of the second switch and the drain terminal of the third switch connected to the second output terminal.

The second capacitor circuit includes a fifth switch, a sixth switch, a seventh switch, and an eighth switch connected in series. The second capacitor circuit includes a second flying capacitor having one end connected to a node between the source terminal of the fifth switch and the drain terminal of the sixth switch and another end connected to a node between the source terminal of the seventh switch and the drain terminal of the eighth switch. The second capacitor circuit includes a node between the source terminal of the sixth switch and the drain terminal of the seventh switch connected to the first output terminal.

The first output circuit includes a ninth switch, a tenth switch, an eleventh switch, and a twelfth switch connected in series between the first input terminal and the second input terminal. The ninth switch includes the drain terminal connected to the first input terminal. The twelfth switch includes the source terminal connected to the second input terminal.

The second output circuit includes a thirteenth switch, a fourteenth switch, a fifteenth switch, and a sixteenth switch connected in series between the first input terminal and the second input terminal. The thirteenth switch includes the drain terminal connected to the first input terminal. The sixteenth switch includes the source terminal connected to the second input terminal.

The first output circuit includes a node between the source terminal of the ninth switch and the drain terminal of the tenth switch connected to the drain terminal of the first switch in the first capacitor circuit, a node between the source terminal of the eleventh switch and the drain terminal of the twelfth switch connected to the source terminal of the fourth switch in the first capacitor circuit, and a node between the source terminal of the tenth switch and the drain terminal of the eleventh switch connected to a node between the first direct current capacitor and the second direct current capacitor in the direct current capacitor circuit.

The second output circuit includes a node between the source terminal of the thirteenth switch and the drain terminal of the fourteenth switch connected to the drain terminal of the fifth switch in the second capacitor circuit, a node between the source terminal of the fifteenth switch and the drain terminal of the sixteenth switch connected to the source terminal of the eighth switch in the second capacitor circuit, and a node between the source terminal of the fourteenth switch and the drain terminal of the fifteenth switch connected to the node between the first direct current capacitor and the second direct current capacitor in the direct current capacitor circuit.

The method includes increasing or decreasing, with the controller, based on a detected voltage value of the first flying capacitor, a value of a gate voltage to be applied to a gate terminal of a target switch to be controlled selectively from the first switch, the second switch, the third switch, and the fourth switch in the first capacitor circuit to cause conduction between the drain terminal and the source terminal of the target switch, or changing, with the controller, a gradient of the value of the gate voltage based on the detected voltage value of the first flying capacitor, and increasing or decreasing, with the controller, based on a detected voltage value of the second flying capacitor, a value of a gate voltage to be applied to a gate terminal of a target switch to be controlled selectively from the fifth switch, the sixth switch, the seventh switch, and the eighth switch in the second capacitor circuit to cause conduction between the drain terminal and the source terminal of the target switch, or changing, with the controller, a gradient of the value of the gate voltage based on the detected voltage value of the second flying capacitor.

With the method according to this aspect, the power converter can relatively increase or decrease the transition time (slew rate) from the off-state to the on-state of each switch for charging and discharging the first flying capacitor circuit 12 and the second flying capacitor circuit 13 based on the detected voltage value (FC1) of the flying capacitor fc1 and the detected voltage value (FC2) of the flying capacitor fc2. The power converter can adjust a difference in switching time for charging and discharging resulting from parameter variations among components by controlling the gate voltage value for each switch included in the first flying capacitor circuit 12 and the second flying capacitor circuit 13. The structure can thus reduce voltage fluctuations resulting from parameter variations among components and improve stability in the multilevel power conversion unit 10 including the flying capacitors.

Advantageous Effects

The technique according to the above aspects of the present invention reduces voltage fluctuations resulting from parameter variations among components and improves stability in the multilevel power converter including the flying capacitors.

DETAILED DESCRIPTION

Example Use

An example use of a structure according to one or more embodiments of the present invention will now be described with reference to the drawings.

Figure 1:
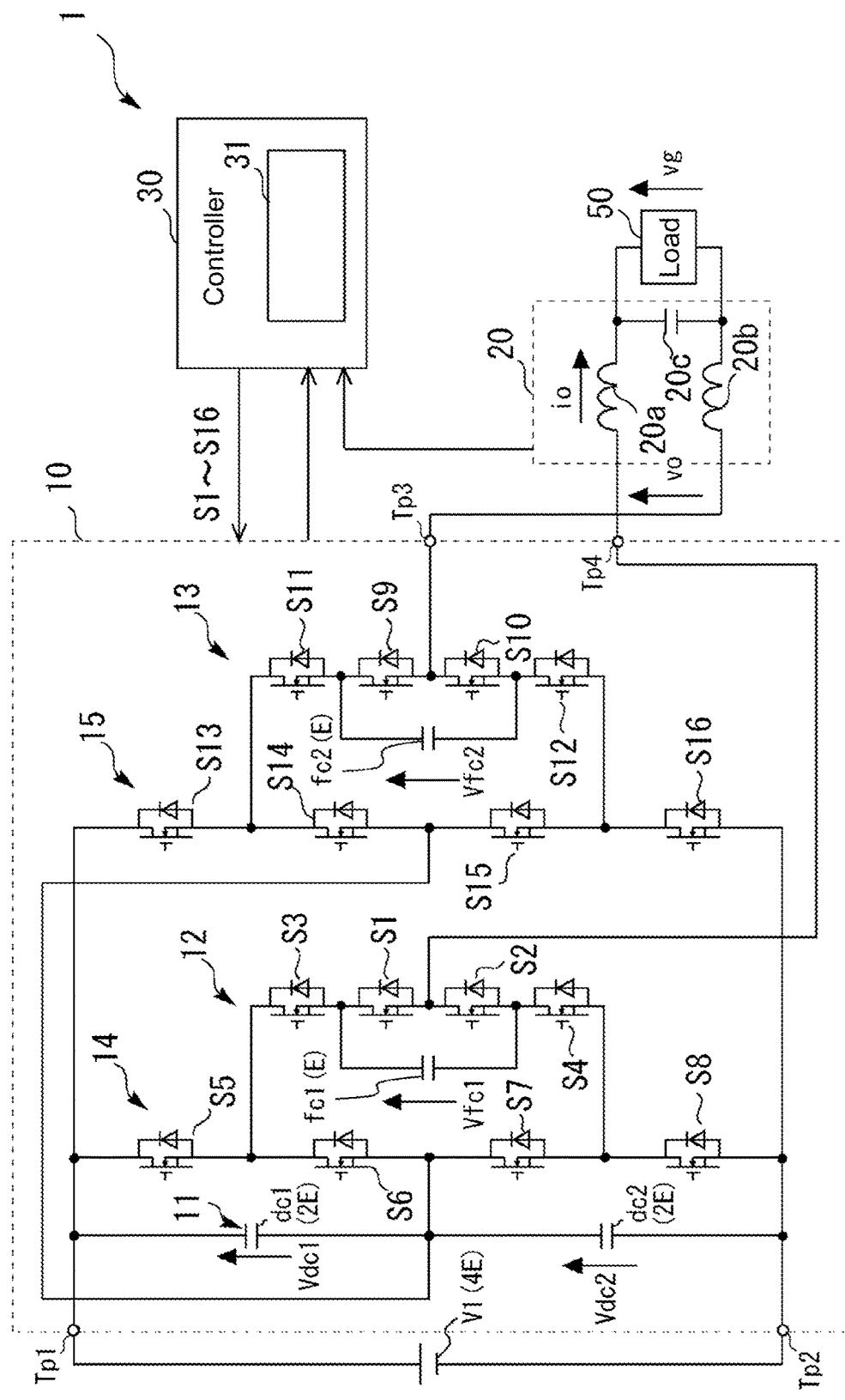
FIG. 1 is a schematic diagram of a power converter according to a first embodiment of the present invention.

FIG. 1 is a schematic block diagram of a power converter 1 according to one example use of the present invention. FIG. 1 shows an example power converter including a power conversion unit 10 that converts direct current (DC) power supplied from a DC power supply V1 to alternating current (AC) power that follows a sinusoidal voltage command value using voltages of multiple levels (five in the present embodiment). The power conversion unit 10 includes a DC capacitor circuit 11, a first flying capacitor circuit 12, a second flying capacitor circuit 13, a first output circuit 14, and a second output circuit 15.

The power conversion unit 10 in this example includes an active neutral point clamped (ANPC) inverter circuit including the first flying capacitor circuit 12, the second flying capacitor circuit 13, the first output circuit 14, and the second output circuit 15. The power conversion unit 10 including the ANPC inverter circuit controls a first DC capacitor dc1 and a second DC capacitor dc2 to be at a voltage 2E and a flying capacitor fc1 and a flying capacitor fc2 to be at a voltage E to generate potentials of five levels (4E, 2E, 0, −2E, and −4E). The generated potentials of five levels are output to an output terminal Tp3 and an output terminal Tp4 through selective control of the open state and the closed state (on and off) of each switch included in the first flying capacitor circuit 12, the second flying capacitor circuit 13, the first output circuit 14, and the second output circuit 15.

The DC capacitor circuit 11 includes the first DC capacitor dc1 and the second DC capacitor dc2 connected in series between an input terminal Tp1 and an input terminal Tp2. The first DC capacitor dc1 has one end connected to the input terminal Tp1. The second DC capacitor dc2 has an end opposite to the node with the first DC capacitor dc1 connected to the input terminal Tp2.

The first flying capacitor circuit 12 includes four switches, a switch S3, a switch S1, a switch S2, and a switch S4, connected in series in the stated order. The first flying capacitor circuit 12 also includes the flying capacitor fc1 having one end connected to the node at which the source terminal of the switch S3 and the drain terminal of the switch S1 are connected and the other end connected to the node at which the source terminal of the switch S2 and the drain terminal of the switch S4 are connected. The node at which the source terminal of the switch S1 and the drain terminal of the switch S2 are connected is connected to the output terminal Tp4 of the power conversion unit 10.

The second flying capacitor circuit 13 includes four switches, a switch S11, a switch S9, a switch S10, and a switch S12, connected in series in the stated order. The second flying capacitor circuit 13 also includes the flying capacitor fc2 having one end connected to the node at which the source terminal of the switch S11 and the drain terminal of the switch S9 are connected and the other end connected to the node at which the source terminal of the switch S10 and the drain terminal of the switch S12 are connected. The node at which the source terminal of the switch S9 and the drain terminal of the switch S10 are connected is connected to the output terminal Tp3 of the power conversion unit 10.

The first output circuit 14 includes four switches, a switch S5, a switch S6, a switch S7, and a switch S8, connected in series in the stated order. The drain terminal of the switch S5 is connected to the input terminal Tp1, and the source terminal of the switch S8 is connected to the input terminal Tp2. The second output circuit 15 includes four switches, a switch S13, a switch S14, a switch S15, and a switch S16, connected in series in the stated order. The drain terminal of the switch S13 is connected to the input terminal Tp1, and the source terminal of the switch S16 is connected to the input terminal Tp2.

The node at which the source terminal of the switch S6 and the drain terminal of the switch S7 in the first output circuit 14 are connected is connected to the node between the first DC capacitor dc1 and the second DC capacitor dc2 in the DC capacitor circuit 11. The node at which the source terminal of the switch S14 and the drain terminal of the switch S15 in the second output circuit 15 are connected is connected to the node between the first DC capacitor dc1 and the second DC capacitor dc2 in the DC capacitor circuit 11.

The drain terminal of the switch S3 in the first flying capacitor circuit 12 is connected to the node at which the source terminal of the switch S5 and the drain terminal of the switch S6 in the first output circuit 14 are connected. The source terminal of the switch S4 in the first flying capacitor circuit 12 is connected to the node at which the source terminal of the switch S7 and the drain terminal of the switch S8 in the first output circuit 14 are connected. The drain terminal of the switch S11 in the second flying capacitor circuit 13 is connected to the node at which the source terminal of the switch S13 and the drain terminal of the switch S14 in the second output circuit are connected. The source terminal of the switch S10 in the second flying capacitor circuit 13 is connected to the node at which the source terminal of the switch S15 and the drain terminal of the switch S16 in the second output circuit 15 are connected.

Figure 2:
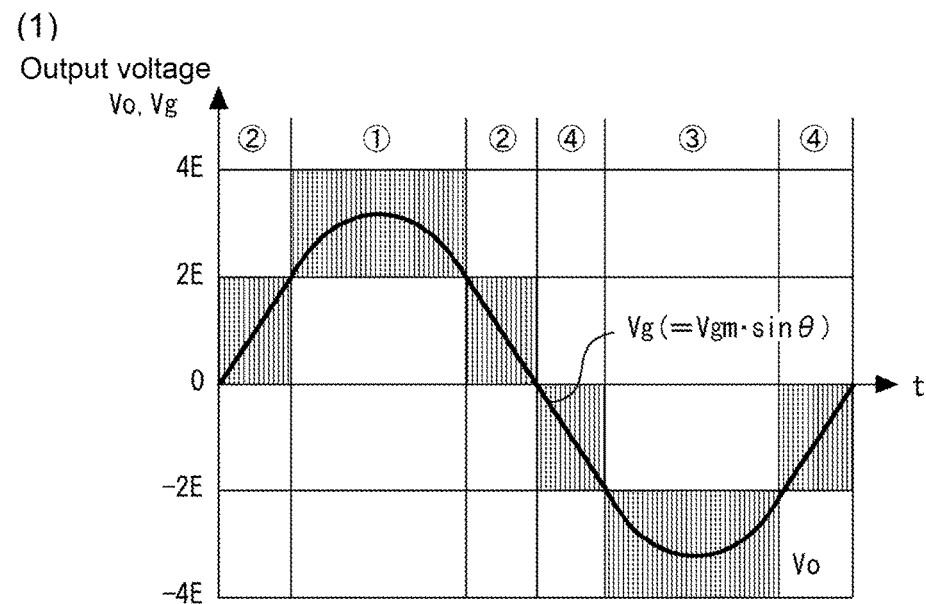
FIG. 2 is a diagram describing AC power generated with potentials of five levels in the first embodiment of the present invention.
Figure 2:
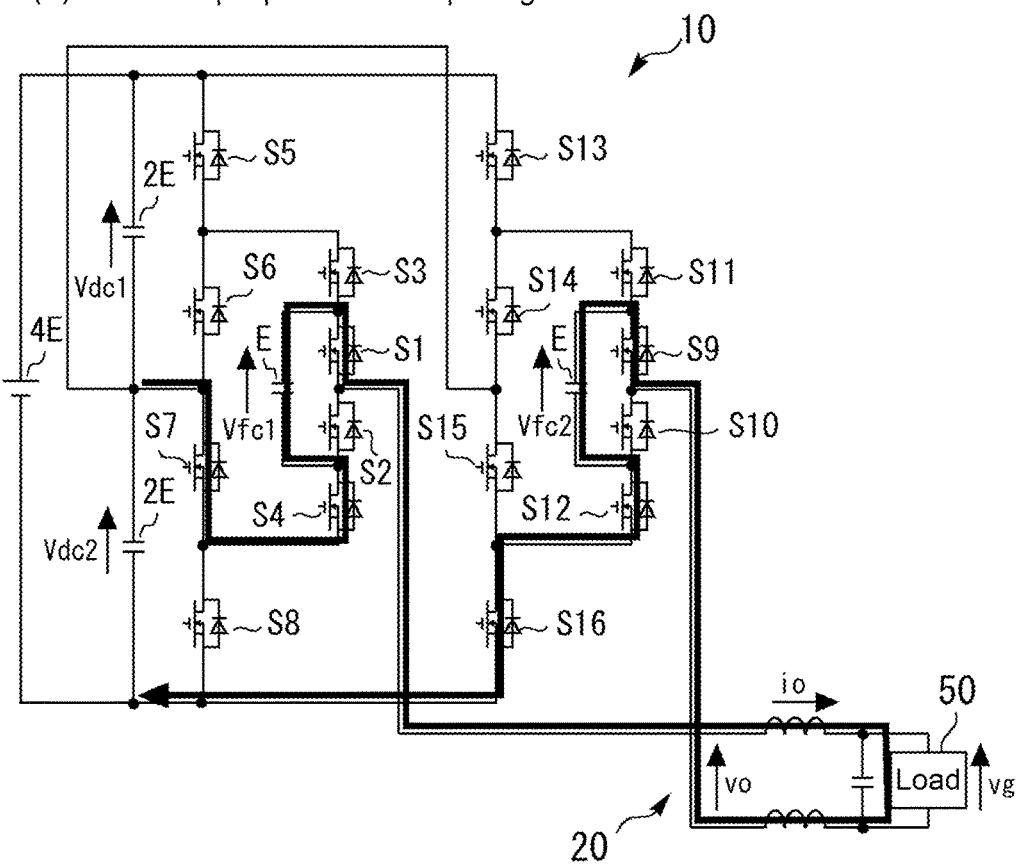
Figure 3:
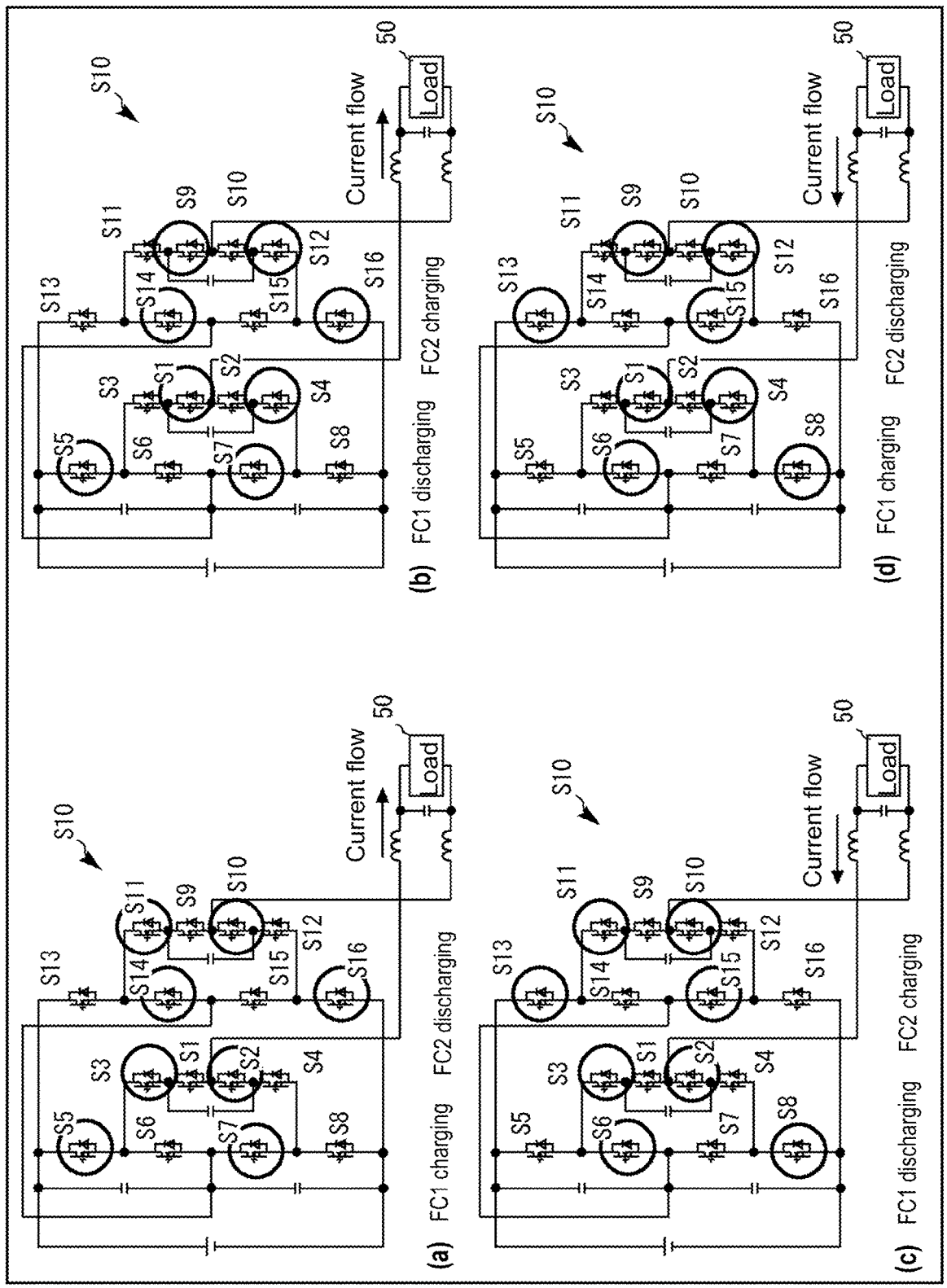
FIG. 3 is a diagram describing charge and discharge modes in flying capacitors in the first embodiment of the present invention.
Figure 4:
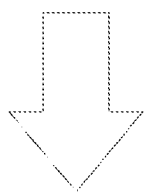
FIG. 4 is a table showing the charge and discharge states of capacitors in a power conversion unit in the first embodiment of the present invention.

As shown in FIGS. 2 to 4, when the time taken for each of the switching patterns in FIG. 3 (a) to (d) is the same, the flying capacitor fc1, the flying capacitor fc2, the first DC capacitor dc1, and the second DC capacitor dc2 each have a constant voltage. For example, each of the flying capacitor fc1 and the flying capacitor fc2 has the voltage E, and each of the first DC capacitor dc1 and the second DC capacitor dc2 has the voltage 2E. However, the components of each of the first flying capacitor circuit 12, the second flying capacitor circuit 13, the first output circuit 14, and the second output circuit 15 have parameter variations. For example, the switches included in each circuit have variations in stray capacitance and resistance, causing a difference in switching time. Any difference in switching time can cause fluctuation of the voltage output from the power conversion unit 10.

As shown in FIGS. 5 to 10, the power converter 1 in this example controls each switch for charging and discharging the flying capacitor fc1 and the flying capacitor fc2 to reduce voltage fluctuations resulting from parameter variations among components. More specifically, the power converter 1 includes a controller 30 that controls the voltage of the flying capacitor fc1 by increasing or decreasing the gate voltages for controlling the opening and closing (on and off) of the switches (S1 to S4) for charging and discharging the flying capacitor fc1 based on the voltage value of the flying capacitor fc1. Similarly, the controller 30 controls the voltage of the flying capacitor fc2 by increasing or decreasing the gate voltages for controlling the opening and closing of the switches (S9 to S12) for charging and discharging the flying capacitor fc2 based on the voltage value of the flying capacitor fc2. This thus increases the gate voltages to be applied to the gate terminals of the switches to relatively decrease the transition time (increase the slew rate) from the on-state to the off-state and decrease the gate voltages to relatively increase the transition time from the on-state to the off-state. The structure in this example can perform the adjustment by controlling the gate voltage value for each switch included in the first flying capacitor circuit 12 and the second flying capacitor circuit 13. The power converter 1 in this example can reduce voltage fluctuations resulting from parameter variations among components and improve stability in the multilevel power conversion unit 10 including the flying capacitors.

First Embodiment

Embodiments of the present invention will now be described in more detail with reference to the drawings.

<Configuration of Power Converter>

FIG. 1 is a schematic block diagram of the power converter 1 according to an embodiment of the present invention. The power converter 1 serves as a power conditioner in a distributed power supply system including, for example, a photovoltaic power generator, a rechargeable battery, or a fuel cell. The power converter 1 is interconnected to the power grid. The distributed power supply in the distributed power supply system, including a photovoltaic power generator, a storage batter, or a fuel cell is connected to a DC-DC converter that can control output of the corresponding distributed power supply to serve as a DC power supply V1. The power converter 1 converts the DC power supplied from the DC power supply V1 to AC power and outputs the resulting AC power to a load 50 and to the interconnected power grid. In the embodiment described below, AC power is output to the load 50. The power converter 1 is connected to, with the input terminal Tp1 and the input terminal Tp2, a DC bus that connects the power converter and the DC-DC converter. In FIG. 1, the input terminal Tp1 is connected to the positive bus of the DC bus, and the input terminal Tp2 is connected to the negative bus of the DC bus.

The power converter 1 includes the power conversion unit 10, a filter 20, and the controller 30. The power conversion unit 10 converts the DC power supplied from the DC power supply V1 to AC power that follows a sinusoidal voltage command value using voltages of multiple levels (five in the present embodiment). The AC power from the power conversion unit 10 is output to the filter 20 through the output terminal Tp3 and the output terminal Tp4. The power conversion unit 10 includes the DC capacitor circuit 11, the first flying capacitor circuit 12, the second flying capacitor circuit 13, the first output circuit 14, and the second output circuit 15. In the present embodiment, the DC capacitor circuit 11 corresponds to an example of a direct current capacitor circuit, the first flying capacitor circuit 12 to an example of a first capacitor circuit, and the second flying capacitor circuit 13 to an example of a second capacitor circuit.

The DC capacitor circuit 11 includes the first DC capacitor dc1 and the second DC capacitor dc2 connected in series between the input terminal Tp1 and the input terminal Tp2. The first DC capacitor dc1 has one end connected to the input terminal Tp1. The second DC capacitor dc2 has an end opposite to the node with the first DC capacitor dc1 connected to the input terminal Tp2. The first DC capacitor dc1 and the second DC capacitor dc2 equally divide the voltage (4E) of the DC power input between the input terminal Tp1 and the input terminal Tp2, with the respective capacitor voltages being 2E as shown in FIG. 1. The first DC capacitor dc1 and the second DC capacitor dc2 also serve as snubbers to reduce surge voltages generated in the power conversion unit 10. In the present embodiment, the first DC capacitor dc1 corresponds to an example of a first direct current capacitor, and the second DC capacitor dc2 to an example of a second direct current capacitor.

The first flying capacitor circuit 12 includes the switch S1, the switch S2, the switch S3, the switch S4, and the capacitor fc1 (hereafter also referred to as the flying capacitor fc1). In the present embodiment, the switch S1 corresponds to an example of a second switch, the switch S2 to an example of a third switch, the switch S3 to an example of a first switch, and the switch S4 to an example of a fourth switch. The capacitor fc1 in the present embodiment corresponds to an example of a first flying capacitor.

The switches S1 to S4 included in the first flying capacitor circuit 12 are, for example, N-channel metal-oxide-semiconductor field-effect transistors (MOSFETs), each with a diode connected between the drain terminal and the source terminal. The diode has the anode connected to the source terminal of the N-channel MOSFET and the cathode connected to the drain terminal. The switches S1 to S4 included in the first flying capacitor circuit 12 are connected in series in the order of the switch S3, the switch S1, the switch S2, and the switch S4 as shown in FIG. 1. The flying capacitor fc1 has one end connected to the node at which the source terminal of the switch S3 and the drain terminal of the switch S1 are connected and the other end connected to the node at which the source terminal of the switch S2 and the drain terminal of the switch S4 are connected. The node at which the source terminal of the switch S1 and the drain terminal of the switch S2 are connected is connected to the output terminal Tp4 of the power conversion unit 10. The output terminal Tp4 in the present embodiment corresponds to an example of a second output terminal.

The second flying capacitor circuit 13 includes the switch S9, the switch S10, the switch S11, the switch S12, and the capacitor fc2 (hereafter also referred to as the flying capacitor fc2). In the present embodiment, the switch S9 corresponds to an example of a sixth switch, the switch S10 to an example of a seventh switch, the switch S11 to an example of a fifth switch, and the switch S12 to an example of an eighth switch. The capacitor fc2 in the present embodiment corresponds to an example of a second flying capacitor.

The switches S9 to S12 included in the second flying capacitor circuit 13 are the same as the switches included in the first flying capacitor circuit 12. In other words, the switches S9 to S12 are N-channel MOSFETs each with a diode connected between the drain terminal and the source terminal. The switches S9 to S12 included in the second flying capacitor circuit 13 are connected in series in the order of the switch S11, the switch S9, the switch S10, and the switch S12 as shown in FIG. 1. The flying capacitor fc2 has one end connected to the node at which the source terminal of the switch S11 and the drain terminal of the switch S9 are connected and the other end connected to the node at which the source terminal of the switch S10 and the drain terminal of the switch S12 are connected. The node at which the source terminal of the switch S9 and the drain terminal of the switch S10 are connected is connected to the output terminal Tp3 of the power conversion unit 10. In the present embodiment, the output terminal Tp3 corresponds to an example of a first output terminal.

The first output circuit 14 includes the switch S5, the switch S6, the switch S7, and the switch S8. The switches S5 to S8 are the same as the switches included in the first flying capacitor circuit 12, each with a diode having the anode connected to the source terminal of the N-channel MOSFET and the cathode connected to the drain terminal. As shown in FIG. 1, the switches S5 to S8 are connected in series in the order of the switch S5, the switch S6, the switch S7, and the switch S8. The switch S5 has the drain terminal connected to the input terminal Tp1. The switch S8 has the source terminal connected to the input terminal Tp2. In the present embodiment, the switch S5 corresponds to an example of a ninth switch, the switch S6 to an example of a tenth switch, the switch S7 to an example of an eleventh switch, and the switch S8 to an example of a twelfth switch.

The second output circuit 15 includes the switch S13, the switch S14, the switch S15, and the switch S16. The switches S13 to S16 are the same as the switches included in the first flying capacitor circuit 12, each with a diode having the anode connected to the source terminal of the N-channel MOSFET and the cathode connected to the drain terminal. As shown in FIG. 1, the switches S13 to S16 are connected in series in the order of the switch S13, the switch S14, the switch S15, and the switch S16. The switch S13 has the drain terminal connected to the input terminal Tp1, and the switch S16 has the source terminal connected to the input terminal Tp2. In the present embodiment, the switch S13 corresponds to an example of a thirteenth switch, the switch S14 to an example of a fourteenth switch, the switch S15 to an example of a fifteenth switch, and the switch S16 to an example of a sixteenth switch.

The node at which the source terminal of the switch S6 and the drain terminal of the switch S7 in the first output circuit 14 are connected is connected to the node between the first DC capacitor dc1 and the second DC capacitor dc2 in the DC capacitor circuit 11. Similarly, the node at which the source terminal of the switch S14 and the drain terminal of the switch S15 in the second output circuit 15 are connected is connected to the node between the first DC capacitor dc1 and the second DC capacitor dc2 in the DC capacitor circuit 11.

The drain terminal of the switch S3 in the first flying capacitor circuit 12 is connected to the node at which the source terminal of the switch S5 and the drain terminal of the switch S6 in the first output circuit 14 are connected. The source terminal of the switch S4 in the first flying capacitor circuit 12 is connected to the node at which the source terminal of the switch S7 and the drain terminal of the switch S8 in the first output circuit 14 are connected.

Similarly, the drain terminal of the switch S11 in the second flying capacitor circuit 13 is connected to the node at which the source terminal of the switch S13 and the drain terminal of the switch S14 in the second output circuit 15 are connected. The source terminal of the switch S12 in the second flying capacitor circuit 13 is connected to the node at which the source terminal of the switch S15 and the drain terminal of the switch S16 in the second output circuit 15 are connected.

As described above, the power conversion unit 10 in the present embodiment includes an ANPC inverter circuit including the first flying capacitor circuit 12, the second flying capacitor circuit 13, the first output circuit 14, and the second output circuit 15. The power conversion unit 10 in the present embodiment including the ANPC inverter circuit controls the first DC capacitor dc1 and the second DC capacitor dc2 to be at the voltage 2E and the flying capacitor fc1 and the flying capacitor fc2 to be at the voltage E to generate potentials of five levels (4E, 2E, 0, −2E, and −4E). The generated potentials of five levels are output to the output terminal Tp3 and the output terminal Tp4 through selective control of the open state and the closed state (on and off) of each switch included in the first flying capacitor circuit 12, the second flying capacitor circuit 13, the first output circuit 14, and the second output circuit 15. In the present embodiment, each switch in an open state refers to the switch being open between the drain terminal and the source terminal and in an off-state. Each switch in a closed state refers to the switch being in a conducting state between the drain terminal and the source terminal and in an on-state.

The power conversion unit 10 in the present embodiment also outputs AC power with the generated potentials of five levels to the load 50 and the interconnected power grid through the node at which the source terminal of the switch S1 and the drain terminal of the switch S2 in the first flying capacitor circuit 12 are connected and the node at which the source terminal of the switch S9 and the drain terminal of the switch S10 in the second flying capacitor circuit 13 are connected. This reduces a common mode in which a current flows in through the reference potential (GND) from devices such as the load 50 connected to the output end of the power converter 1 according to the present embodiment or devices including the DC power supply V1 connected with the DC bus. More specifically, the voltage values of the flying capacitor fc1, the flying capacitor fc2, the first DC capacitor dc1, and the second DC capacitor dc2 farther from intended values can cause more noise in the common mode, whereas such voltage values closer to the intended values can cause less noise in the common mode.

The filter 20 includes an inductor 20a, an inductor 20b, and a capacitor 20c. The inductor 20a has one end connected to the output terminal Tp4 and the other end connected to one end of the capacitor 20c. The inductor 20b has one end connected to the output terminal Tp3 and the other end connected to the other end of the capacitor 20c. The filter 20 reduces the harmonic components of the AC power output from the first flying capacitor circuit 12 and the second flying capacitor circuit 13 and outputs the AC power to the load 50 connected to the power converter 1 and the interconnected power grid. In the filter 20, the output current value io of the AC power generated by the power conversion unit 10 for output to the load 50 is measured with a current sensor. The output voltage value vo (voltage applied to the capacitor 20c) of the AC power is measured with a voltage sensor.

The controller 30 includes, for example, a processor (e.g., central processing unit or CPU), a memory, a gate driver including a gate driver circuit 31, and a communication interface circuit. The gate driver circuit 31 is, as described later, dedicated to controlling the gate voltages of the switches (S1 to S4 and S9 to S12) included in the first flying capacitor circuit 12 and the second flying capacitor circuit 13. The power conversion unit 10 in the present embodiment controls the opening and closing (on and off) of each switch to be controlled by controlling the gate voltage through the gate driver circuit 31.

The controller 30 receives outputs from various sensors (voltage and current sensors) in the power conversion unit 10 and from the current sensor and the voltage sensor in, for example, the filter 20. The controller 30 outputs a control signal to control the opening and closing (on and off) of each switch included in the power conversion unit 10. The controller controls the opening and closing of the switches S1 to S16 based on information detected with the various sensors described above, thus controlling the voltage values of the first DC capacitor dc1 and the second DC capacitor dc2 to be 2E and the voltage values of the flying capacitor fc1 and the flying capacitor fc2 to be E. Similarly, the voltage values clamped in the first DC capacitor dc1, the second DC capacitor dc2, the flying capacitor fc1, and the flying capacitor fc2 are charged and discharged by selectively opening and closing the switches S1 to S16. This generates potentials of five levels (4E, 2E, 0, −2E, and −4E). The generated potentials of five levels are modulated with, for example, carrier comparison-based pulse width modulation (PWM) and then undergo addition and subtraction operations following a sinusoidal voltage command value based on a control pattern for selecting the opening and closing of each switch. The resulting potential is then output to the output terminal Tp3 and the output terminal Tp4.

FIG. 2 is a diagram describing AC power generated with the potentials of five levels. FIG. 2 (1) is a graph showing an example waveform of the AC power generated with the potentials of five levels. FIG. 2 (2) shows an example switching pattern for outputting the generated potential 2E. In FIG. 2 (1), the vertical axis indicates the output voltage of the power conversion unit 10, and the horizontal axis indicates time. The output voltage Vo represents the AC voltage input into the filter 20. The output voltage Vg represents the AC voltage input into the load 50. The graph Vg (=Vgm sine) in FIG. 2 (1) represents the trend of the sinusoidal voltage command value, where m is the modulation rate. In FIG. 2, Vgm=4E·m.

As shown in FIG. 2 (1), in the sections labeled with the circled 2, PWM is performed between potentials 0 and 2E to cause the voltage value to follow the sinusoidal voltage command value. Similarly, PWM is performed in the section labeled with the circled 1 between potentials 2E and 4E to cause the voltage value to follow the sinusoidal voltage command value, performed in the sections labeled with the circled 4 between potentials 0 and −2E, and performed in the section labeled with the circled 3 between potentials −2E and −4E. The controller 30 outputs the voltage to the output terminal Tp3 and the output terminal Tp4 based on the switching pattern for outputting the AC power generated in each section to cause the voltage value to follow the sinusoidal voltage command value. The switching pattern herein refers to a combination of conducting or open switches for outputting the voltage value modulated in each section following the sinusoidal voltage command value. The controller 30 selects the switches to be open or closed for each section to control the conduction or opening of the switches, thus controlling the charging and discharging of the flying capacitor fc1 and the flying capacitor fc2. The energy in the flying capacitor fc1 and the flying capacitor fc2 charges through the energy charged in the first DC capacitor dc1 and the second DC capacitor dc2.

In FIG. 2 (2), the thick solid arrow represents the path of current flow when the potential 2E is output. When the potential 2E is output as in FIG. 2 (2), each switch on the path represented by the thick solid arrow is in the conducting state. In other words, the switch S7 included in the first output circuit 14 is in the conducting state between the drain terminal and the source terminal. Each of the switch S4 and the switch S1 included in the first flying capacitor circuit 12 is in the conducting state between the drain terminal and the source terminal. The switch S16 included in the second output circuit 15 is in the conducting state between the drain terminal and the source terminal. Each of the switch S12 and the switch S9 included in the second flying capacitor circuit 13 is in the conducting state between the drain terminal and the source terminal. The controller 30 changes the operating voltage of the gate terminal of each of the above switches to the on-state to cause conduction between the drain terminal and the source terminal of each of the switch S7, the switch S4, the switch S1, the switch S16, the switch S12, and the switch S9. This discharges the energy charged in the flying capacitor fc1 in the first flying capacitor circuit 12 and charges the energy into the flying capacitor fc2 in the second flying capacitor circuit 13. The potential 2E across the terminals of the second DC capacitor dc2 is output to the filter through the output terminal Tp4 connected to the source terminal of the switch S1 in the first flying capacitor circuit 12 and the output terminal Tp3 connected to the source terminal of the switch S9 in the second flying capacitor circuit 13. More specifically, the output voltage value vo detected in the filter 20 can be expressed as {VDC2+VFC1−VFC2}, where the voltage value of the second DC capacitor dc2 is VDC2, the energy charged in the flying capacitor fc1 is VFC1, and the energy charged in the flying capacitor fc2 is VFC2.

FIG. 3 is a diagram describing charge and discharge modes in the flying capacitor fc1 and the flying capacitor fc2. In FIG. 3, the thick solid arrows also represent the paths of current flow. The first flying capacitor circuit 12 has two different current paths for charging and discharging the flying capacitor fc1. The second flying capacitor circuit 13 also has two different current paths for charging and discharging the flying capacitor fc2. The power conversion unit 10 including the first flying capacitor circuit 12 and the second flying capacitor circuit 13 thus has four different switching patterns shown in FIG. 3 (a) to (d). In the power conversion unit in the present embodiment, the on-off states of the switches S1 to S16 included in the first flying capacitor circuit 12, the second flying capacitor circuit 13, the first output circuit 14, and the second output circuit 15 are controlled to output the voltage following the sinusoidal voltage command value. In FIG. 3 (a) to (d), the switches in circles are in the conducting state between the drain terminal and the source terminal and are in the on-state. In FIGS. 3 (a) and (b), the current flows from the power conversion unit to the load 50. In FIGS. 3 (c) and (d), the current flows from the load 50 to the power conversion unit 10.

In the switching pattern shown in FIG. 3 (a), the switch S3 and the switch S2 in the first flying capacitor circuit 12 are each in the conducting state between the drain terminal and the source terminal and are in the on-state. The switch S5 and the switch S7 in the first output circuit 14 are each in the conducting state between the drain terminal and the source terminal and are in the on-state. The switch S11 and the switch S10 in the second flying capacitor circuit 13 are each in the conducting state between the drain terminal and the source terminal and are in the on-state. The switch S14 and the switch S16 in the second output circuit 15 are each in the conducting state between the drain terminal and the source terminal and are in the on-state. This forms a current path to the load 50 through the drain terminal of the switch S5 connected to the high potential terminal of the first DC capacitor dc1 and the source terminal of the switch S14 connected to the low potential terminal of the first DC capacitor dc1. In other words, the current path forms from the high potential terminal to the low potential terminal of the first DC capacitor dc1 as a path including, in the stated order, the switch S5, the switch S3, the flying capacitor fc1, the switch S2, the load 50, the switch S10, the flying capacitor fc2, the switch S11, and the switch S14. This switching pattern charges the flying capacitor fc1 and discharges the flying capacitor fc2.

In the switching pattern shown in FIG. 3 (b), the switch S1 and the switch S4 in the first flying capacitor circuit 12 are each in the conducting state between the drain terminal and the source terminal and are in the on-state. The switch S5 and the switch S7 in the first output circuit 14 are each in the conducting state between the drain terminal and the source terminal and are in the on-state. The switch S9 and the switch S12 in the second flying capacitor circuit 13 are each in the conducting state between the drain terminal and the source terminal and are in the on-state. The switch S14 and the switch S16 in the second output circuit 15 are each in the conducting state between the drain terminal and the source terminal and are in the on-state. This forms a current path to the load 50 through the drain terminal of the switch S7 connected to the high potential terminal of the second DC capacitor dc2 and the source terminal of the switch S16 connected to the low potential terminal of the second DC capacitor dc2. In other words, the current path forms from the high potential terminal to the low potential terminal of the second DC capacitor dc2 as a path including, in the stated order, the switch S7, the switch S4, the flying capacitor fc1, the switch S1, the load 50, the switch S9, the flying capacitor fc2, the switch S12, and the switch S16. This switching pattern discharges the flying capacitor fc1 and charges the flying capacitor fc2.

In the switching pattern shown in FIG. 3 (c), the switch S3 and the switch S2 in the first flying capacitor circuit 12 are each in the conducting state between the drain terminal and the source terminal and are in the on-state. The switch S6 and the switch S8 in the first output circuit 14 are each in the conducting state between the drain terminal and the source terminal and are in the on-state. The switch S11 and the switch S10 in the second flying capacitor circuit 13 are each in the conducting state between the drain terminal and the source terminal and are in the on-state. The switch S13 and the switch S15 in the second output circuit 15 are each in the conducting state between the drain terminal and the source terminal and are in the on-state. This forms a current path from the load 50 to the power conversion unit 10 through the drain terminal of the switch S16 connected to the high potential terminal of the first DC capacitor dc1 and the source terminal of the switch S6 connected to the low potential terminal of the first DC capacitor dc1. In other words, the current path forms from the high potential terminal to the low potential terminal of the first DC capacitor dc1 as a path including, in the stated order, the switch S13, the switch S11, the flying capacitor fc2, the switch S10, the load 50, the switch S2, the flying capacitor fc1, the switch S3, and the switch S6. This switching pattern charges the flying capacitor fc2 and discharges the flying capacitor fc1.

In the switching pattern shown in FIG. 3 (d), the switch S1 and the switch S4 in the first flying capacitor circuit 12 are each in the conducting state between the drain terminal and the source terminal and are in the on-state. The switch S6 and the switch S8 in the first output circuit 14 are each in the conducting state between the drain terminal and the source terminal and are in the on-state. The switch S9 and the switch S12 in the second flying capacitor circuit 13 are each in the conducting state between the drain terminal and the source terminal and are in the on-state. The switch S13 and the switch S15 in the second output circuit 15 are each in the conducting state between the drain terminal and the source terminal and are in the on-state. This forms a current path from the load 50 to the power conversion unit 10 through the drain terminal of the switch S15 connected to the high potential terminal of the second DC capacitor dc2 and the source terminal of the switch S8 connected to the low potential terminal of the second DC capacitor dc2. In other words, the current path forms from the high potential terminal to the low potential terminal of the second DC capacitor dc2 as a path including, in the stated order, the switch S15, the switch S12, the flying capacitor fc2, the switch S9, the load 50, the switch S1, the flying capacitor fc1, the switch S4, and the switch S8. This switching pattern discharges the flying capacitor fc2 and charges the flying capacitor fc1.

FIG. 4 is a table showing the switching patterns in FIG. 3 and the charge and discharge states of the capacitors included in the power conversion unit 10. An example table Tb1 in FIG. 4 shows the switching patterns described with reference to FIG. 3 and the charge and discharge states of the flying capacitor fc1, the flying capacitor fc2, the first DC capacitor dc1, and the second DC capacitor dc2. As shown in the table Tb1 in FIG. 4, in the switching pattern in FIG. 3 (a), the flying capacitor fc1 charges, the flying capacitor fc2 discharges, the first DC capacitor dc1 discharges, and the second DC capacitor dc2 charges. In the switching pattern in FIG. 3 (b), the flying capacitor fc1 discharges, the flying capacitor fc2 charges, the first DC capacitor dc1 charges, and the second DC capacitor dc2 discharges. Similarly, in the switching pattern in FIG. 3 (c), the flying capacitor fc1 discharges, the flying capacitor fc2 charges, the first DC capacitor dc1 discharges, and the second DC capacitor dc2 charges. In the switching pattern in FIG. 3 (d), the flying capacitor fc1 charges, the flying capacitor fc2 discharges, the first DC capacitor dc1 charges, and the second DC capacitor dc2 discharges.

As shown in FIG. 4, when the time taken for each of the switching patterns in FIG. 3 (a) to (d) is the same, the flying capacitor fc1, the flying capacitor fc2, the first DC capacitor dc1, and the second DC capacitor dc2 each have a constant voltage. For example, each of the flying capacitor fc1 and the flying capacitor fc2 has the voltage E, and each of the first DC capacitor dc1 and the second DC capacitor dc2 has the voltage 2E. However, the components of each of the first flying capacitor circuit 12, the second flying capacitor circuit 13, the first output circuit 14, and the second output circuit 15 have parameter variations. For example, the switches included in each circuit have variations in stray capacitance and resistance, causing a difference in switching time. A difference in switching time between the switches included in the first flying capacitor circuit 12 and the second flying capacitor circuit 13 causes relative fluctuations in charging and discharging the flying capacitor fc1 and the flying capacitor fc2, and can cause fluctuations in the voltage output to the load. The voltage values of the flying capacitor fc1, the flying capacitor fc2, the first DC capacitor dc1, and the second DC capacitor dc2 farther from intended values can cause more noise in the common mode, whereas such voltage values closer to the intended values can cause less noise in the common mode.

The power converter 1 according to the present embodiment controls each switch for charging and discharging the flying capacitor fc1 and the flying capacitor fc2 to reduce voltage fluctuations resulting from parameter variations among components. More specifically, the power converter 1 includes the controller 30 that controls the voltage of the flying capacitor fc1 by increasing or decreasing the gate voltages for controlling the opening and closing (on and off) of the switches (S1 to S4) for charging and discharging the flying capacitor fc1. Similarly, the controller 30 controls the voltage of the flying capacitor fc2 by increasing or decreasing the gate voltages for controlling the opening and closing of the switches (S9 to S12) for charging and discharging the flying capacitor fc2. In the examples below, each switch in an open state refers to each switch being open (in an off-state) between the drain terminal and the source terminal. Each switch in a closed state refers to each switch being in a conducting state (in an on-state) between the drain terminal and the source terminal. The gate voltage for controlling the opening and closing of the switches is in an active high state. More specifically, the gate voltage shifts to the off-state (in which the connection between the drain terminal and the source terminal is open) when the gate voltage is low, and shifts to the on-state (in which the connection between the drain terminal and the source terminal is conducting) when the gate voltage is high.

The controller 30 in the present embodiment increases or decreases the gate voltages for controlling the opening and closing of the switches (S1 to S4) for charging and discharging, or in other words, the gate voltage values to be applied to the gate terminals based on the voltage value of the flying capacitor fc1. Similarly, the controller 30 increases or decreases the gate voltage values for controlling the opening and closing of the switches (S9 to S12) for charging and discharging based on the voltage value of the flying capacitor fc2. The gate voltage value is increased or decreased within a voltage range defined by a switching device to be controlled. In the present embodiment, the gate voltage to be applied to the gate terminal of a switch is increased to relatively decrease the transition time (increase the slew rate) from the on-state to the off-state and is decreased to relatively increase the transition time from the on-state to the off-state. This structure can adjust a difference in switching time for charging and discharging resulting from parameter variations among components in the power conversion unit 10 by controlling the gate voltage value for each switch included in the first flying capacitor circuit 12 and the second flying capacitor circuit 13. The power converter 1 according to the present embodiment can reduce voltage fluctuations resulting from parameter variations among components and improve stability in the multilevel power conversion unit 10 including the flying capacitors.

In the example described below, the gate voltage value is increased or decreased within the voltage range defined by each switching device to be controlled. The same effects as produced by such a structure may be produced by changing the rising and falling slopes of the waveform of the gate voltage (changing the gradient of the voltage value) to be applied to the gate terminal of each switching device to be controlled. For example, the waveform of a gate voltage is changed to a sine waveform to relatively increase the transition time from the on-state to the off-state and to a trapezoidal or rectangular waveform to relatively decrease the transition time from the on-state to the off-state. This control method can also adjust, using each switch included in the first flying capacitor circuit 12 and the second flying capacitor circuit 13, a difference in switching time for charging and discharging resulting from parameter variations among components in the power conversion unit 10 and improve stability.

Figure 5:
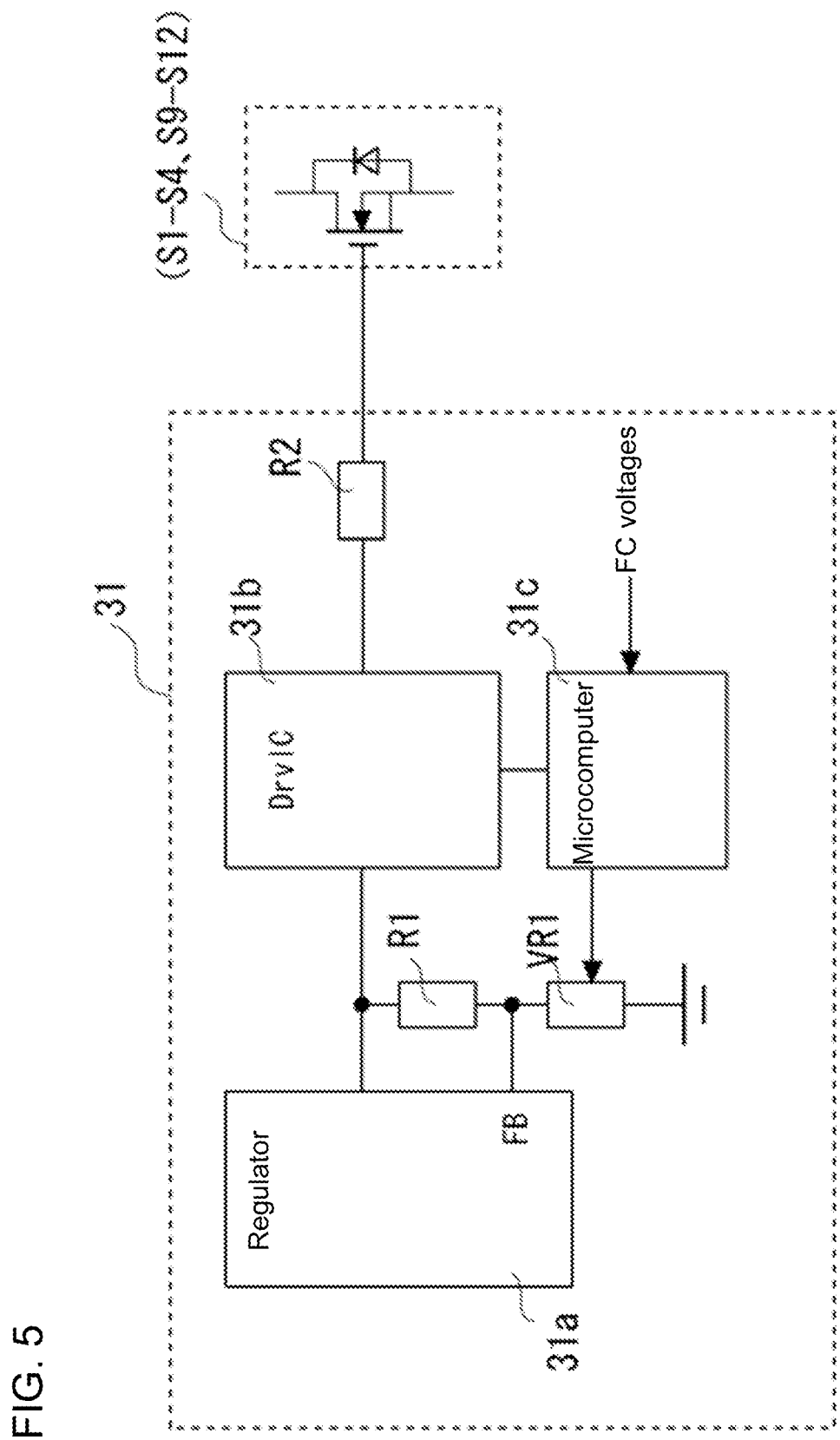
FIG. 5 is a diagram describing an example of gate voltage control in the first embodiment of the present invention.

FIG. 5 is a diagram describing the gate voltage control of the flying capacitors. In the present embodiment, the gate driver circuit 31 controls the gate voltages of the switches (S1 to S4 and S9 to S12) included in the first flying capacitor circuit 12 and the second flying capacitor circuit 13. As shown in FIG. 5, the gate driver circuit 31 includes a regulator 31a that generates the gate voltages, a dedicated driver integrated circuit (IC) 31b that drives the switches, and a microcomputer 31c that controls the gate voltages based on the magnitudes of flying capacitor voltages (FC voltages). The driver IC 31b is connected to the gate terminals of the switches (S1 to S4 and S9 to S12) to be controlled. The processor (e.g., CPU) included in the controller 30 may also be used as the microcomputer 31c included in the gate driver circuit 31. The microcomputer 31c receives inputs of the voltage values of the flying capacitor fc1 and the flying capacitor fc2 detected with various sensors in the power conversion unit 10.

The regulator 31a in FIG. 5 includes a resistor R1 having one end connected to the voltage output of the regulator and the other end connected to the feedback (FB) terminal of the regulator, and a variable resistor VR1 having one end connected to the feedback input of the regulator and the other end grounded to a reference potential. The regulator 31a generates the gate voltage within the voltage range defined by the specifications of each switch based on a voltage value divided by the resistor R1 and the variable resistor VR1 and to be input into the FB terminal. The gate voltages generated by the regulator 31a are output to the driver IC 31b connected to the regulator. The driver IC 31b is connected to the microcomputer 31c and receives an input control command to select the connection state (conducting state or open state) between the drain terminal and the source terminal of each of the switches (S1 to S4 and S9 to S12) to be controlled. The driver IC 31b outputs, in response to the control command, the input gate voltage as a drive voltage to change the status of each switch to be controlled. The gate terminal of each switch to be controlled receives a high status or low status drive voltage output in response to the status indicated by the control command through the resistor R2.

Figure 6:
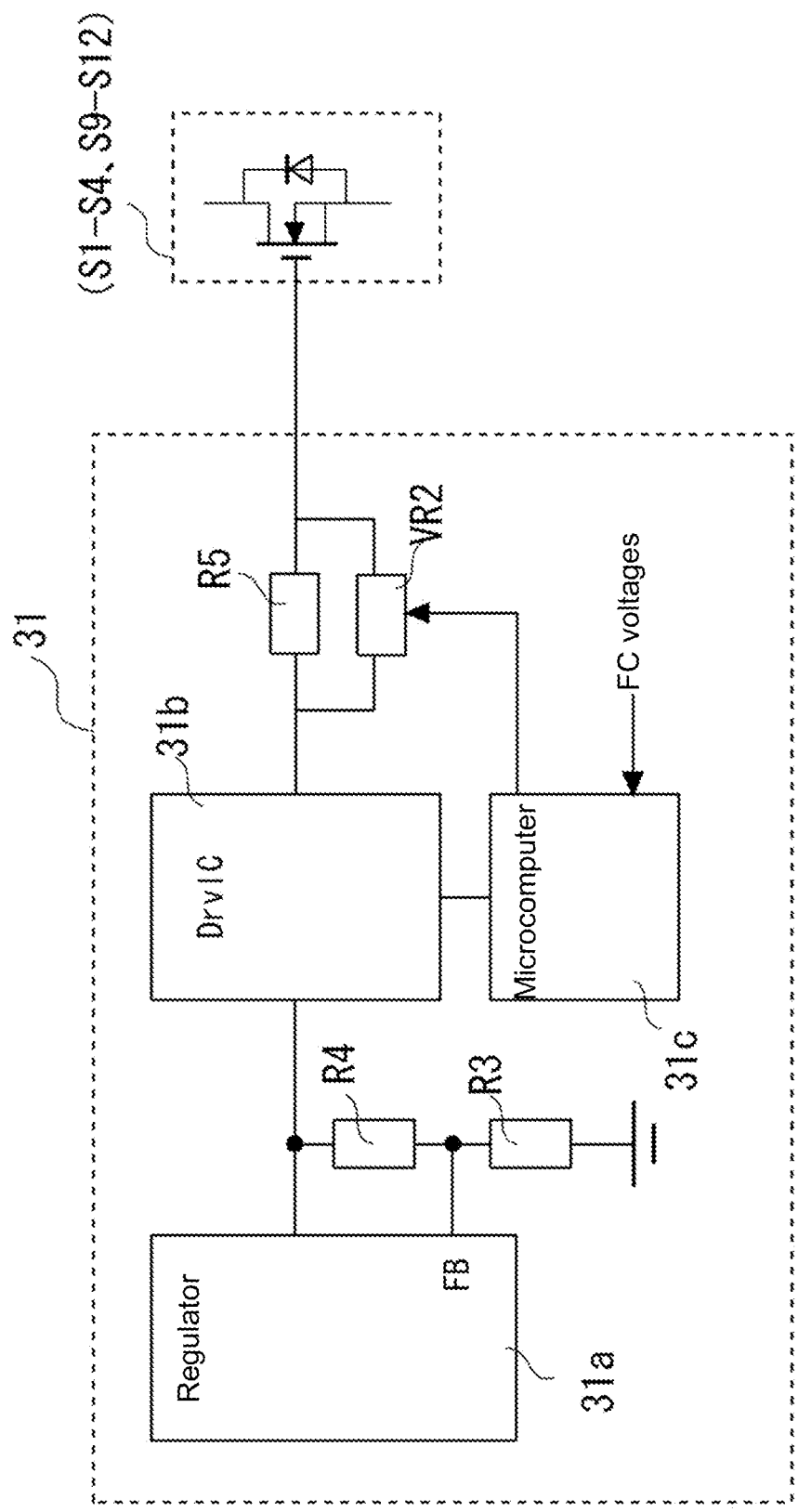
FIG. 6 is a diagram describing another example of gate voltage control in the first embodiment of the present invention.

The microcomputer 31c increases or decreases the resistance value of the variable resistor VR1 included in the regulator 31a based on the input voltage values of the flying capacitors (fc1 and fc2). For example, the microcomputer 31c decreases the resistance value when the voltage values of the flying capacitors (fc1 and fc2) are greater than a predetermined voltage value (E). The microcomputer 31c increases the resistance value when the voltage values of the flying capacitors (fc1 and fc2) are less than or equal to the predetermined voltage value (E). An example of such a variable resistor that can increase or decrease a resistance value in response to a command from the microcomputer 31c is a digital potentiometer including fixed resistors in a series array with multiple unit steps of resistance values. The digital potentiometer can switch the number of fixed resistors in the series array in response to a command from the microcomputer 31c to obtain an intended resistance value. The microcomputer 31c can adjust the gate voltage values in accordance with a resistance value defined for each unit step by switching the number of fixed resistors in the digital potentiometer based on the voltage values of the flying capacitors (fc1 and fc2). In the example of FIG. 5, the gate voltage values generated by the regulator 31a are controlled using the variable resistor VR1. FIG. 6 shows another example manner of varying the gate voltages applied to the switches to be controlled. In the example of FIG. 6, the structure changes the rising and falling slopes of the waveforms of the gate voltage applied to the gate terminal of each switching device to be controlled, or in other words, changes the gradient of the gate voltage value.

FIG. 6 is a diagram describing another example of gate voltage control of the flying capacitors. In the example of FIG. 6, a variable resistor VR2 is connected in parallel to a resistor R5. In this example, the gate voltages output from the driver IC 31b are increased or decreased through the gate resistors (VR2 and R5) connected to the gate terminals of the switches (S1 to S4 and S9 to S12) to be controlled. The regulator 31a, the driver IC 31b, and the microcomputer 31c included in the gate driver circuit 31 in FIG. 6 are the same as in FIG. 5. The microcomputer 31c receives inputs of the voltage values of the flying capacitor fc1 and the flying capacitor fc2 detected with various sensors in the power conversion unit 10.

The regulator 31a in FIG. 6 includes a resistor R4 having one end connected to the voltage output of the regulator and the other end to the FB terminal of the regulator, and a resistor R3 having one end connected to the feedback input of the regulator and the other end grounded to the reference potential. The regulator 31a generates, based on a voltage value divided by the resistor R4 and the resistor R3 and input into the FB terminal, gate voltages within the voltage range defined by the specifications of each switch. The regulator 31a outputs the gate voltages to the driver IC 31b. The driver IC 31b outputs, in response to a control command from the microcomputer 31c, the input gate voltages as the drive voltages for the switches to be controlled. The gate terminal of each switch to be controlled receives a high status or low status gate voltage output in response to the status indicated by the control command through the resistor R5 and the variable resistor VR2 as the gate resistors. The variable resistance VR2 in this example may also be a digital potentiometer that can increase or decrease the resistance value in response to a command from the microcomputer 31c.

The microcomputer 31c increases or decreases the resistance value of the variable resistor VR2 connected in parallel to the resistor R2 based on the input voltage values of the flying capacitors (fc1 and fc2). The microcomputer 31c in this example increases the resistance value when the voltage values of the flying capacitors (fc1 and fc2) are greater than the predetermined voltage value (E), and decreases the resistance value when the voltage values of the flying capacitors (fc1 and fc2) are less than or equal to the predetermined voltage value (E). The microcomputer 31c in this example can switch the number of fixed resistors in the digital potentiometer based on the voltage values of the flying capacitors (fc1 and fc2) to vary the gate resistance values of resistors (R5 and VR2) and adjust the gate voltage values in accordance with a resistance value defined for each unit step.

<Controller and Microcomputer Configurations>

Figure 7:
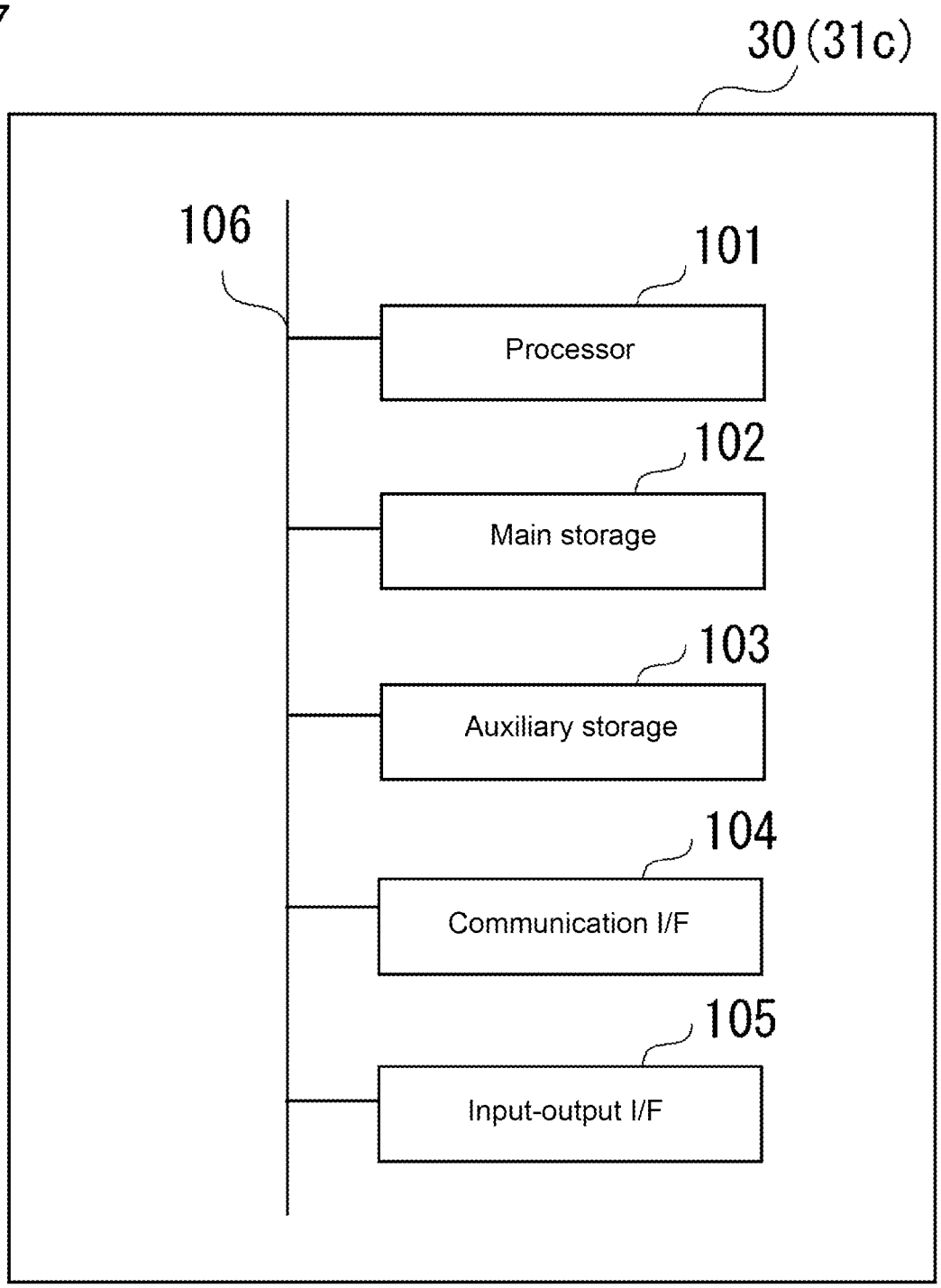
FIG. 7 is a diagram of a controller and a microcomputer in the first embodiment of the present invention showing their hardware configurations.

FIG. 7 is a diagram of the controller 30 in the power converter 1 according to the present embodiment showing the hardware configuration. As shown in FIG. 7, the controller 30 is a computer including, as its components, a processor 101, a main storage 102, an auxiliary storage 103, a communication interface (I/F) 104, and an input-output interface (I/F) 105 interconnected with a connection bus 106. The main storage 102 and the auxiliary storage 103 are recording media readable by the controller 30. The controller 30 may include multiple processors 101, main storages 102, auxiliary storages 103, communication interfaces 104, and input-output interfaces 105, or eliminate at least one of the components. The microcomputer 31*c* included in the gate driver circuit 31 may have the same configuration as the controller 30.

The processor 101 is a central processing arithmetic unit that centrally controls the controller 30 or the microcomputer 31*c*. The processor 101 is, for example, a central processing unit (CPU), a micro processing unit (MPU), or a digital signal processor (DSP). The processor 101 loads, for example, a program stored in the auxiliary storage 103 into the work area of the main storage 102 in an executable manner and controls peripheral devices by executing the program to provide intended functions. Some or all of the functions of the processor 101 may be provided by, for example, an application-specific integrated circuit (ASIC) or a graphics processing unit (GPU). Similarly, some or all of the functions may be implemented by dedicated large scale integration (LSI) such as a field-programmable gate array (FPGA), a numerical processor, or other hardware circuits.

The main storage 102 and the auxiliary storage 103 serve as the memory of the controller 30 or the microcomputer 31*c*. The main storage 102 stores, for example, programs executable by the processor 101 and data to be processed by the processor. The main storage 102 includes a flash memory, a random-access memory (RAM), or a read-only memory (ROM). The auxiliary storage 103 is a storage medium that stores programs executable by the processor 101 and other devices, as well as configuration information for operation. The auxiliary storage 103 includes, for example, a hard disk drive (HDD), a solid state drive (SSD), an erasable programmable read-only memory (EPROM), a flash memory, a universal serial bus (USB) memory, and a secure digital (SD) memory card.

The communication I/F 104 is a communication interface. The communication I/F 104 may have another configuration as appropriate for the connection method with the device to be connected to the controller 30. The controller 30 provides various control commands to the power conversion unit 10 connected with the communication I/F 104. The controller 30 obtains signals output from various sensors in each component of the power converter 1 connected with the communication I/F 104. The input-output I/F 105 allows input and output of data with the input device and the output device included in the power converter 1. The microcomputer 31*c* obtains the voltage values of the flying capacitors (fc1 and fc2) through the input-output I/F 105. The microcomputer 31*c* outputs commands to the variable resistors (VR1 and VR2) and control commands to the driver IC 31*b* through the input-output I/F 105.

<Process>

Figure 8:
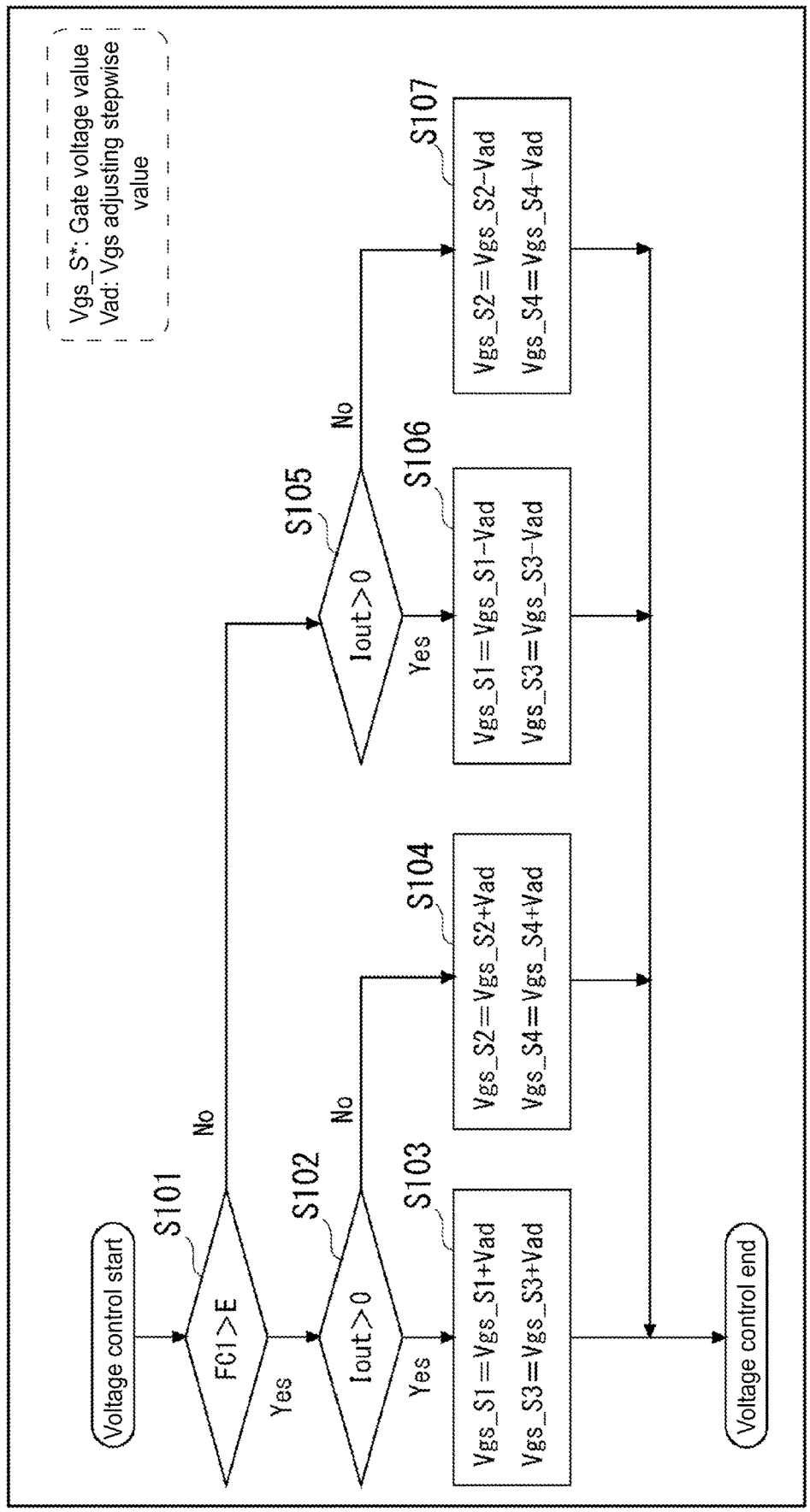
FIG. 8 is a flowchart showing an example of a gate voltage control process in the first embodiment of the present invention.

FIG. 8 is a flowchart showing an example of a gate voltage control process performed by the power converter 1 according to the present embodiment. In the process in FIG. 8, the gate voltages are controlled based on the voltage values of the flying capacitor fc1 and the flying capacitor fc2 to stabilize the voltages of the multilevel power conversion unit 10 including the flying capacitors. In the example process in FIG. 8, the gate voltage control of the flying capacitor fc1 is performed. The same process applies to gate voltage control of the flying capacitor fc2. More specifically, FC1 in FIG. 8 is replaceable with FC2, which is the voltage value of the flying capacitor fc2, and Vgs_S1 to Vgs_S4 are respectively replaceable with Vgs_S9 to Vgs_S12. The process in FIG. 8 may be performed by the microcomputer 31*c* in the gate driver circuit 31 or by the controller 30. The process in FIG. 8 is performed periodically at regular intervals.

In the process in FIG. 8, after the voltage control process is started, the determination is performed as to whether the voltage value of the flying capacitor fc1 in the power conversion unit 10 is greater than the constant value (E) (step S101). The microcomputer 31*c* in the power converter 1 obtains the voltage value (FC1) of the flying capacitor fc1 detected with a voltage sensor included in the first flying capacitor circuit 12. In step S101, when the voltage value (FC1) of the flying capacitor fc1 is greater than the constant value (E) (Yes in step S101), the processing advances to step S102. When the voltage value (FC1) is not greater than the constant value (E) (No in step S101), the processing advances to step S105.

In step S102, the direction of the current flow is determined based on an output current value Iout of the AC power generated by the power conversion unit 10 and output to the load 50. More specifically, when the output current value Iout is greater than 0 A, the current path is determined to be from the power conversion unit to the load 50. When the output current value Iout is not greater than 0 A, the current path is determined to be from the load 50 to the power conversion unit 10. The output current value Iout is detected with a current sensor in the filter 20. In step S102, when the output current value Iout is greater than 0 A (Yes in step S102), the processing advances to step S103. When the output current value Iout is not greater than 0 A (No in step S102), the processing advances to step S104.

In step S103, the switch S1 and the switch S3 are controlled to increase the gate voltages and cause the voltage value (FC1) of the flying capacitor fc1 to be the constant value (E). For example, the microcomputer 31*c* increases the gate voltage values to be applied to the gate terminals of the switch S1 and the switch S3 by varying the resistance value of the variable resistor VR1 or the variable resistor VR2. The voltage value between the gate terminal and the source terminal of the switch S1 is referred to as Vgs_S1, and the voltage value between the gate terminal and the source terminal of the switch S3 as Vgs_S3. A value for adjusting the gate voltage in a stepwise manner with the variable resistor VR1 or the variable resistor VR2 is referred to as Vad. In step S103, the gate voltage value of the switch S1 is increased to Vgs_S1+Vad, and the gate voltage value of the switch S3 is increased to Vgs_S3+Vad. This process can relatively decrease the transition time (increase the slew rate) of each of the switch S1 and the switch S3 from the off-state to the on-state and adjust the length of the discharging period of the flying capacitor fc1. After step S103, this routine ends temporarily.

In step S104, the switch S2 and the switch S4 are controlled to increase the gate voltages and cause the voltage value (FC1) of the flying capacitor fc1 to be the constant value (E). For example, the microcomputer 31*c* increases the gate voltage values to be applied to the gate terminals of the switch S2 and the switch S4 by varying the resistance value of the variable resistor VR1 or the variable resistor VR2. The voltage value between the gate terminal and the source terminal of the switch S2 is referred to as Vgs_S2, and the voltage value between the gate terminal and the source terminal of the switch S4 as Vgs_S4. A value for adjusting the gate voltage in a stepwise manner with the variable resistor VR1 or the variable resistor VR2 is referred to as Vad. In step S104, the gate voltage value of the switch S2 is increased to Vgs_S2+Vad, and the gate voltage value of the switch S4 is increased to Vgs_S4+Vad. This process can relatively decrease the transition time of each of the switch S2 and the switch S4 from the off-state to the on-state and adjust the length of the charging period of the flying capacitor fc1. After step S104, the routine ends temporarily.

In step S105, the same processing as in step S102 is performed. More specifically, the direction of the current flow is determined based on the output current value Iout of the AC power generated by the power conversion unit 10 and output to the load 50. When the output current value Iout is greater than 0 A, the current path is determined to be from the power conversion unit 10 to the load 50. When the output current value Iout is not greater than 0 A, the current path is determined to be from the load 50 to the power conversion unit 10. In step S105, when the output current value Iout is greater than 0 A (Yes in step S105), the processing advances to step S106. When the output current value Iout is not greater than 0 A (No in step S105), the processing advances to step S107.

In step S106, the switch S1 and the switch S3 are controlled to decrease the gate voltages and cause the voltage value (FC1) of the flying capacitor fc1 to be the constant value (E). For example, the microcomputer 31c decreases the gate voltage values to be applied to the gate terminals of the switch S1 and the switch S3 by varying the resistance value of the variable resistor VR1 or the variable resistor VR2. The voltage value between the gate terminal and the source terminal of the switch S1 is referred to as Vgs_S1, and the voltage value between the gate terminal and the source terminal of the switch S3 as Vgs_S3. The value for adjusting the gate voltage in a stepwise manner with the variable resistor VR1 or the variable resistor VR2 is referred to as Vad. In step S106, the gate voltage value of the switch S1 is decreased to Vgs_S1−Vad, and the gate voltage value of the switch S3 is decreased to Vgs_S3−Vad. This process can relatively increase the transition time of each of the switch S1 and the switch S3 from the off-state to the on-state and adjust the length of the charging period of the flying capacitor fc1. After step S106, the routine ends temporarily.

In step S107, the switch S2 and the switch S4 are controlled to decrease the gate voltages and cause the voltage value (FC1) of the flying capacitor fc1 to be the constant value (E). For example, the microcomputer 31c decreases the gate voltage values to be applied to the gate terminals of the switch S2 and the switch S4 by varying the resistance value of the variable resistor VR1 or the variable resistor VR2. The voltage value between the gate terminal and the source terminal of the switch S2 is referred to as Vgs_S2, and the voltage value between the gate terminal and the source terminal of the switch S4 as Vgs_S4. The value for adjusting the gate voltage in a stepwise manner with the variable resistor VR1 or the variable resistor VR2 is referred to as Vad. In step S107, the gate voltage value of the switch S2 is decreased to Vgs_S2−Vad, and the gate voltage value of the switch S4 is decreased to Vgs_S4−Vad". This process can relatively increase the transition time of each of the switch S2 and the switch S4 from the off-state to the on-state and adjust the length of the discharging period of the flying capacitor fc1. After step S107, the routine ends temporarily.

As described above, the power converter 1 according to the present embodiment can increase or decrease the gate voltages of the switches (S1 to S4) for charging and discharging the flying capacitor fc1 based on the voltage value (FC1) of the flying capacitor fc1. The power converter 1 can increase or decrease the gate voltages of the switches (S9 to S12) for charging and discharging the flying capacitor fc2 by performing the process in FIG. 8 for the flying capacitor fc2. The power converter 1 can increase the gate voltage to be applied to the gate terminal of a switch to relatively decrease the transition time (increase the slew rate) from the on-state to the off-state, and decrease the gate voltage to relatively increase the transition time from the on-state to the off-state. This structure can thus control the gate voltage value for each switch included in the first flying capacitor circuit 12 and the second flying capacitor circuit 13 and adjust a difference in switching time for charging and discharging resulting from parameter variations among components. The power converter 1 according to the present embodiment can reduce voltage fluctuations resulting from parameter variations among components and improve stability in the multilevel power conversion unit 10 including the flying capacitors.

The power converter 1 can determine whether the voltage values of the flying capacitor fc1 and the flying capacitor fc2 are greater than the constant value (E) and determine the direction of the output current flow of the AC power generated by the power conversion unit 10 and output to the load 50. The power converter 1 can increase the gate voltage values to be applied to the gate terminals of the switch S1 and the switch S3 when the voltage value of the flying capacitor fc1 is greater than the constant value (E) and the current flows through a current path from the power conversion unit 10 to the load 50. The power converter 1 can increase the gate voltage values to be applied to the gate terminals of the switch S9 and the switch S11 when the voltage value of the flying capacitor fc2 is greater than the constant value (E) and the current flows through a current path from the power conversion unit 10 to the load 50. This structure can thus relatively decrease the transition time of each of the switch S1 and the switch S3 from the off-state to the on-state and adjust the length of the discharging period of the flying capacitor fc1. The structure can also relatively decrease the transition time of each of the switch S9 and the switch S11 from the off-state to the on-state and adjust the length of the charging period of the flying capacitor fc2.

The power converter 1 can increase the gate voltage values to be applied to the gate terminals of the switch S2 and the switch S4 when the voltage value of the flying capacitor fc1 is greater than the constant value (E) and the current flows through a current path from the load 50 to the power conversion unit 10. Similarly, the power converter 1 can increase the gate voltage values to be applied to the gate terminals of the switch S10 and the switch S12 when the voltage value of the flying capacitor fc2 is greater than the constant value (E) and the current flows through a current path from the load 50 to the power conversion unit 10. This structure can thus relatively decrease the transition time of each of the switch S2 and the switch S4 from the off-state to the on-state and adjust the length of the charging period of the flying capacitor fc1. The structure can also relatively decrease the transition time of each of the switch S10 and the switch S12 from the off-state to the on-state and adjust the length of the discharging period of the flying capacitor fc2.

The power converter 1 can decrease the gate voltage values to be applied to the gate terminals of the switch S1 and the switch S3 when the voltage value of the flying capacitor fc1 is less than or equal to the constant value (E) and the current flows through a current path from the power conversion unit 10 to the load 50. Similarly, the power converter 1 can decrease the gate voltage values to be applied to the gate terminals of the switch S9 and the switch S11 when the voltage value of the flying capacitor fc2 is less than or equal to the constant value (E) and the current flows through a current path from the power conversion unit 10 to the load 50. This structure can thus relatively increase the transition time of each of the switch S1 and the switch S3 from the off-state to the on-state and adjust the length of the charging period of the flying capacitor fc1. The structure can also increase the transition time of each of the switch S9 and the switch S11 from the off-state to the on-state and adjust the length of the discharging period of the flying capacitor fc2.

The power converter 1 can decrease the gate voltage values to be applied to the gate terminals of the switch S2 and the switch S4 when the voltage value of the flying capacitor fc1 is less than or equal to the constant value (E) and the current flows through a current path from the load 50 to the power conversion unit 10. Similarly, the power converter 1 can decrease the gate voltage values to be applied to the gate terminals of the switch S10 and the switch S12 when the voltage value of the flying capacitor fc2 is less than or equal to the constant value (E) and the current flows through a current path from the load 50 to the power conversion unit 10. This structure can thus relatively increase the transition time of each of the switch S2 and the switch S4 from the off-state to the on-state and adjust the length of the discharging period of the flying capacitor fc1. The structure can also relatively increase the transition time of each of the switch S10 and the switch S12 from the off-state to the on-state and adjust the length of the charging period of the flying capacitor fc2.

Figure 9:
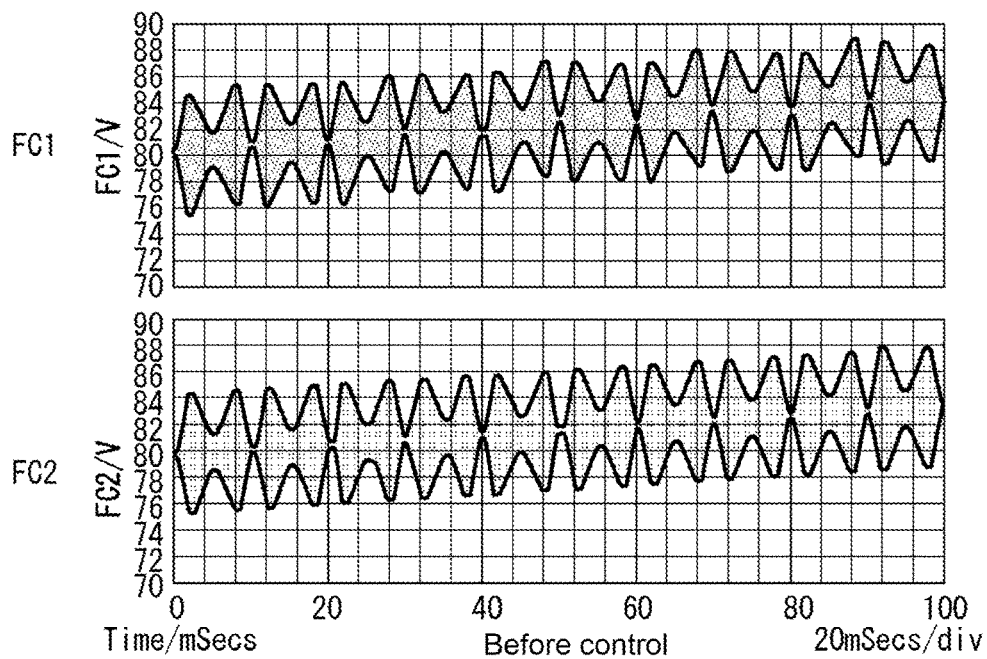
FIG. 9 is a diagram showing example simulation results of gate voltage control in the first embodiment of the present invention.
Figure 9:
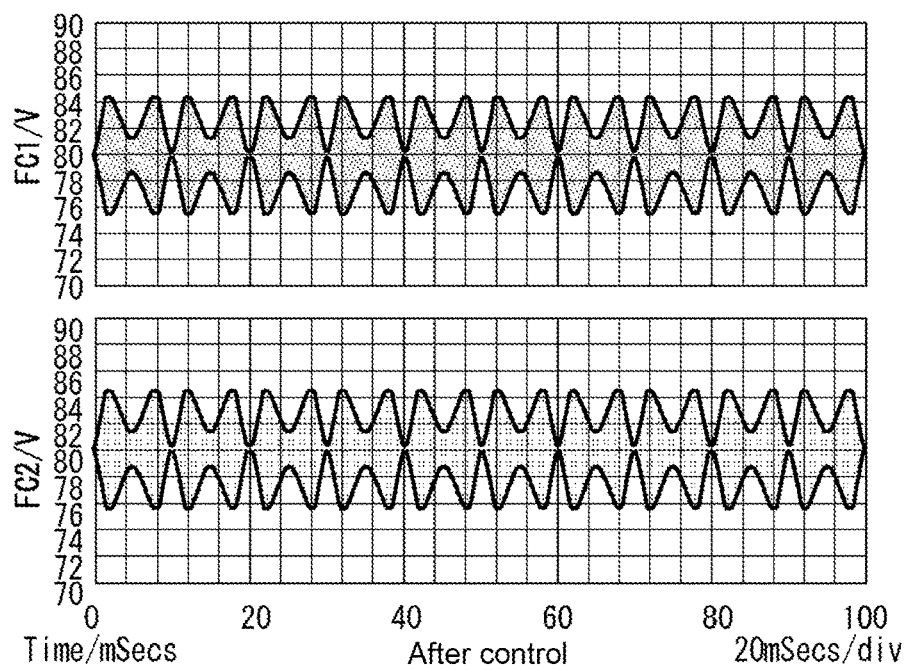

FIG. 9 is a diagram showing simulation results obtained with a gate voltage control method according to the present embodiment. The simulation uses the variable resistor VR1 to control the increase or decrease of the values of gate voltages generated by the regulator 31*a* as described with reference to FIG. 5. FIG. 9 (1) is a graph showing the trend of the power output of the power conversion unit 10 before the gate voltage control according to the present embodiment is performed. FIG. 9 (2) is a graph showing the trend of the power output of the power conversion unit 10 when the gate voltage control according to the embodiment is performed. The vertical axis in each graph indicates the voltage values (FC1 and FC2) of the flying capacitors (fc1 and fc2). The horizontal axis indicates time.

As shown in FIG. 9 (1), voltage fluctuations result from parameter variations among components before the gate voltage control according to the present embodiment is performed. The central values of the voltage values (FC1 and FC2) of the flying capacitors (fc1 and fc2) increase linearly from about 80 to 84 V over time. When the gate voltage control according to the present embodiment is performed, as shown in FIG. 9 (2), less voltage fluctuations result from parameter variations among components. The central values of the voltage values (FC1 and FC2) of the flying capacitors (fc1 and fc2) are stably at about 80 V.

Figure 10:
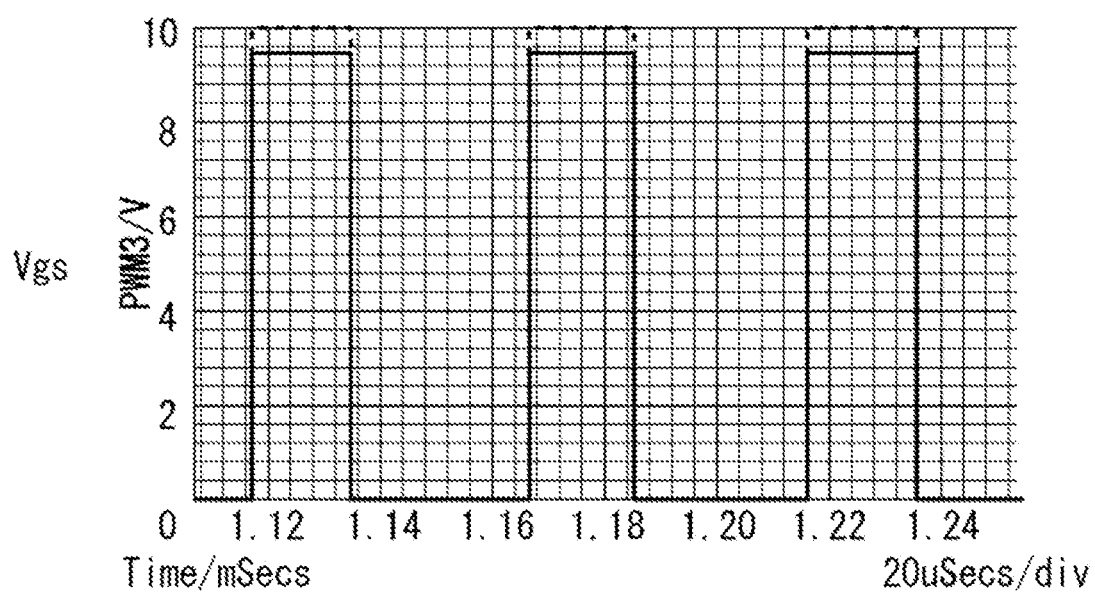
FIG. 10 is a diagram showing an example trend of a voltage Vgs in the first embodiment of the present invention.

FIG. 10 is a graph showing the trend of the voltage value Vgs between the gate terminal and the source terminal of a switch obtained with the gate voltage control method according to the present embodiment. The vertical axis in FIG. 10 indicates the gate voltage value resulting from PWM in response to a control command from the microcomputer 31*c*. The horizontal axis indicates time. The rectangles indicated by the dashed lines in FIG. 10 represent the gate voltage value increased with the gate voltage control method. The rectangles indicated by the solid lines represent the gate voltage value decreased with the gate voltage control method. As shown in FIG. 10, the voltage value in the on-state that causes conduction between the drain terminal and the source terminal of the switch is controlled between about 9.5 and 10 V. The transition time (slew rate) for the voltage value (Vgs) between the drain terminal and the source terminal of the switch to change from the on-state to the off-state is thus relatively decreased by increasing the gate voltage and relatively increased by decreasing the gate voltage.

(Others)

The above embodiments are mere examples. The embodiments may be appropriately changed without departing from the spirit and scope of the disclosure. The processing or the units described herein may be combined in any manner unless such combinations cause technical conflicts between them.

A process performed by a single device may be performed by multiple devices in a shared manner. The processes performed by different devices may be performed by a single device. The computer system may flexibly change the hardware configuration to implement each function.

<<Computer-Readable Recording Medium>>

A program that causes an information processing device, or other machines or devices (hereafter referred to as computers), to implement any of the above functions may be recorded on a recording medium readable by computers. The computers can read and execute the program in the recording medium to provide the functions.

The computer-readable recording medium includes a recording medium storing information such as data and programs in an electrical, magnetic, optical, mechanical, or chemical manner for computers to read the information from the recording medium. Examples of such a recording medium removable from computers include a flexible disk, a magneto-optical disk, a compact disc read-only memory (CD-ROM), a compact disc-rewritable (CD-RW), a digital versatile disc (DVD), a Blu-ray disc, digital audio tape (DAT), 8 mm tape, a flash memory, and other memory cards. Examples of a recording media fixed to computers include hard disks and ROMs.

The elements in the aspects of the present invention below are identified with reference numerals used in the drawings to show the correspondence between these elements and the components in the embodiments.

<Aspect 1>

A power converter (1), comprising:

a controller (30); and a power conversion unit (10) configured to cause, based on a control command from the controller (30), conduction or opening between a drain terminal and a source terminal of each of a plurality of switches and convert direct current power input into a first input terminal (Tp1) and a second input terminal (Tp2) to alternating current power to output the alternating current power from a first output terminal (Tp3) and a second output terminal (Tp4), the power conversion unit (10) including a direct current capacitor circuit (11) including a first direct current capacitor (dc1) and a second direct current capacitor (dc2) connected in series between the first input terminal (Tp1) and the second input terminal (Tp2), the first direct current capacitor (dc1) having an end connected to the first input terminal (Tp1), the second direct current capacitor (dc2) having an end connected to the second input terminal (Tp2), a first capacitor circuit (12) including a first switch (S3), a second switch (S1), a third switch (S2), and a fourth switch (S4) connected in series, the first capacitor circuit (12) including a first flying capacitor (fc1) having one end connected to a node between the source terminal of the first switch (S3) and the drain terminal of the second switch (S1) and another end connected to a node between the source terminal of the third switch (S2) and the drain terminal of the fourth switch (S4), the first capacitor circuit (12) including a node between the source terminal of the second switch (S1) and the drain terminal of the third switch (S2) connected to the second output terminal (Tp4), a second capacitor circuit (13) including a fifth switch (S11), a sixth switch (S9), a seventh switch (S10), and an eighth switch (S12) connected in series, the second capacitor circuit (13) including a second flying capacitor (fc2) having one end connected to a node between the source terminal of the fifth switch (S11) and the drain terminal of the sixth switch (S9) and another end connected to a node between the source terminal of the seventh switch (S10) and the drain terminal of the eighth switch (S12), the second capacitor circuit (13) including a node between the source terminal of the sixth switch (S9) and the drain terminal of the seventh switch (S10) connected to the first output terminal (Tp3), a first output circuit (14) including a ninth switch (S5), a tenth switch (S6), an eleventh switch (S7), and a twelfth switch (S8) connected in series between the first input terminal (Tp1) and the second input terminal (Tp2), the ninth switch (S5) including the drain terminal connected to the first input terminal (Tp1), the twelfth switch (S8) including the source terminal connected to the second input terminal (Tp2), and a second output circuit (15) including a thirteenth switch (S13), a fourteenth switch (S14), a fifteenth switch (S15), and a sixteenth switch (S16) connected in series between the first input terminal (Tp1) and the second input terminal (Tp2), the thirteenth switch (S13) including the drain terminal connected to the first input terminal (Tp1), the sixteenth switch (S16) including the source terminal connected to the second input terminal (Tp2), the first output circuit (14) including a node between the source terminal of the ninth switch (S5) and the drain terminal of the tenth switch (S6) connected to the drain terminal of the first switch (S3) in the first capacitor circuit (12), a node between the source terminal of the eleventh switch (S7) and the drain terminal of the twelfth switch (S8) connected to the source terminal of the fourth switch (S4) in the first capacitor circuit (12), and a node between the source terminal of the tenth switch (S6) and the drain terminal of the eleventh switch (S7) connected to a node between the first direct current capacitor (dc1) and the second direct current capacitor (dc2) in the direct current capacitor circuit (11), the second output circuit (15) including a node between the source terminal of the thirteenth switch (S13) and the drain terminal of the fourteenth switch (S14) connected to the drain terminal of the fifth switch (S11) in the second capacitor circuit (13), a node between the source terminal of the fifteenth switch (S15) and the drain terminal of the sixteenth switch (S16) connected to the source terminal of the eighth switch (S12) in the second capacitor circuit (13), and a node between the source terminal of the fourteenth switch (S14) and the drain terminal of the fifteenth switch (S15) connected to the node between the first direct current capacitor (dc1) and the second direct current capacitor (dc2) in the direct current capacitor circuit (11), the controller (30) being configured to increase or decrease, based on a detected voltage value of the first flying capacitor (fc1), a value of a gate voltage to be applied to a gate terminal of a target switch to be controlled selectively from the first switch (S3), the second switch (S1), the third switch (S2), and the fourth switch (S4) in the first capacitor circuit (12) to cause conduction between the drain terminal and the source terminal of the target switch, or to change a gradient of the value of the gate voltage based on the detected voltage value of the first flying capacitor (fc1), the controller (30) being configured to increase or decrease, based on a detected voltage value of the second flying capacitor (fc2), a value of a gate voltage to be applied to a gate terminal of a target switch to be controlled selectively from the fifth switch (S11), the sixth switch (S9), the seventh switch (S10), and the eighth switch (S12) in the second capacitor circuit (13) to cause conduction between the drain terminal and the source terminal of the target switch, or to change a gradient of the value of the gate voltage based on the detected voltage value of the second flying capacitor (fc2).

REFERENCE SIGNS LIST 1 power converter
10 power conversion unit
11 DC capacitor circuit
12 first flying capacitor circuit
13 second flying capacitor circuit
14 first output circuit
15 second output circuit
20 filter
30 controller
31 gate driver circuit
31a regulator
31b driver IC
31c microcomputer
50 load
101 processor
102 main storage
103 auxiliary storage
104 communication I/F
105 input-output I/F
106 connection bus
dc1 first DC capacitor
dc2 second DC capacitor
fc1 flying capacitor (first flying capacitor)
fc2 flying capacitor (second flying capacitor)
S1, S2, S3, S4, S5, S6, S7, S8, S9, S10, S11, S12, S13, S14, S15, S16 switch
Tp1, Tp2 input terminal
Tp3, Tp4 output terminal
V1 DC power supply
VR1, VR2 variable resistor (digital potentiometer)

The invention claimed is:

1. A power converter, comprising:
a controller; and
a power conversion unit configured to cause, based on a control command from the controller, conduction or opening between a drain terminal and a source terminal of each of a plurality of switches and convert direct current power input into a first input terminal and a second input terminal to alternating current power to output the alternating current power from a first output terminal and a second output terminal, the power conversion unit including a direct current capacitor circuit including a first direct current capacitor and a second direct current capacitor connected in series between the first input terminal and the second input terminal, the first direct current capacitor having an end connected to the first input terminal, the second direct current capacitor having an end connected to the second input terminal, a first capacitor circuit including a first switch, a second switch, a third switch, and a fourth switch connected in series, the first capacitor circuit including a first flying capacitor having one end connected to a node between the source terminal of the first switch and the drain terminal of the second switch and another end connected to a node between the source terminal of the third switch and the drain terminal of the fourth switch, the first capacitor circuit including a node between the source terminal of the second switch and the drain terminal of the third switch connected to the second output terminal, a second capacitor circuit including a fifth switch, a sixth switch, a seventh switch, and an eighth switch connected in series, the second capacitor circuit including a second flying capacitor having one end connected to a node between the source terminal of the fifth switch and the drain terminal of the sixth switch and another end connected to a node between the source terminal of the seventh switch and the drain terminal of the eighth switch, the second capacitor circuit including a node between the source terminal of the sixth switch and the drain terminal of the seventh switch connected to the first output terminal, a first output circuit including a ninth switch, a tenth switch, an eleventh switch, and a twelfth switch connected in series between the first input terminal and the second input terminal, the ninth switch including the drain terminal connected to the first input terminal, the twelfth switch including the source terminal connected to the second input terminal, and a second output circuit including a thirteenth switch, a fourteenth switch, a fifteenth switch, and a sixteenth switch connected in series between the first input terminal and the second input terminal, the thirteenth switch including the drain terminal connected to the first input terminal, the sixteenth switch including the source terminal connected to the second input terminal, the first output circuit including a node between the source terminal of the ninth switch and the drain terminal of the tenth switch connected to the drain terminal of the first switch in the first capacitor circuit, a node between the source terminal of the eleventh switch and the drain terminal of the twelfth switch connected to the source terminal of the fourth switch in the first capacitor circuit, and a node between the source terminal of the tenth switch and the drain terminal of the eleventh switch connected to a node between the first direct current capacitor and the second direct current capacitor in the direct current capacitor circuit, the second output circuit including a node between the source terminal of the thirteenth switch and the drain terminal of the fourteenth switch connected to the drain terminal of the fifth switch in the second capacitor circuit, a node between the source terminal of the fifteenth switch and the drain terminal of the sixteenth switch connected to the source terminal of the eighth switch in the second capacitor circuit, and a node between the source terminal of the fourteenth switch and the drain terminal of the fifteenth switch connected to the node between the first direct current capacitor and the second direct current capacitor in the direct current capacitor circuit, the controller being configured to increase or decrease, based on a detected voltage value of the first flying capacitor, a value of a gate voltage to be applied to a gate terminal of a target switch to be controlled selectively from the first switch, the second switch, the third switch, and the fourth switch in the first capacitor circuit to cause conduction between the drain terminal and the source terminal of the target switch, or to change a gradient of the value of the gate voltage based on the detected voltage value of the first flying capacitor, the controller being configured to increase or decrease, based on a detected voltage value of the second flying capacitor, a value of a gate voltage to be applied to a gate terminal of a target switch to be controlled selectively from the fifth switch, the sixth switch, the seventh switch, and the eighth switch in the second capacitor circuit to cause conduction between the drain terminal and the source terminal of the target switch, or to change a gradient of the value of the gate voltage based on the detected voltage value of the second flying capacitor.

2. The power converter according to claim 1, wherein the controller increases a value of a gate voltage to be applied to a gate terminal of each of the second switch and the first switch in the first capacitor circuit to cause conduction between the drain terminal and the source terminal of each of the second switch and the first switch or increases a gradient of the value of the gate voltage in response to the detected voltage value of the first flying capacitor being greater than a first voltage value and the alternating current power having a current value greater than a predetermined value.

3. The power converter according to claim 1, wherein the controller increases a value of a gate voltage to be applied to a gate terminal of each of the third switch and the fourth switch in the first capacitor circuit to cause conduction between the drain terminal and the source terminal of each of the third switch and the fourth switch or increases a gradient of the value of the gate voltage in response to the detected voltage value of the first flying capacitor being greater than a first voltage value and the alternating current power having a current value less than or equal to a predetermined value.

4. The power converter according to claim 1, wherein the controller decreases a value of a gate voltage to be applied to a gate terminal of each of the second switch and the first switch in the first capacitor circuit to cause conduction between the drain terminal and the source terminal of each of the second switch and the first switch or decreases a gradient of the value of the gate voltage in response to the detected voltage value of the first flying capacitor being less than or equal to a first voltage value and the alternating current power having a current value greater than a predetermined value.

5. The power converter according to claim 1, wherein the controller decreases a value of a gate voltage to be applied to a gate terminal of each of the third switch and the fourth switch in the first capacitor circuit to cause conduction between the drain terminal and the source terminal of each of the third switch and the fourth switch or decreases a gradient of the value of the gate voltage in response to the detected voltage value of the first flying capacitor being less than or equal to a first voltage value and the alternating current power having a current value less than or equal to a predetermined value.

6. The power converter according to claim 1, wherein the controller increases a value of a gate voltage to be applied to a gate terminal of each of the sixth switch and the fifth switch in the second capacitor circuit to cause conduction between the drain terminal and the source terminal of each of the sixth switch and the fifth switch or increases a gradient of the value of the gate voltage in response to the detected voltage value of the second flying capacitor being greater than a first voltage value and the alternating current power having a current value greater than a predetermined value.

7. The power converter according to claim 1, wherein the controller increases a value of a gate voltage to be applied to a gate terminal of each of the seventh switch and the eighth switch in the second capacitor circuit to cause conduction between the drain terminal and the source terminal of each of the seventh switch and the eighth switch or increases a gradient of the value of the gate voltage in response to the detected voltage value of the second flying capacitor being greater than a first voltage value and the alternating current power having a current value less than or equal to a predetermined value.

8. The power converter according to claim 1, wherein the controller decreases a value of a gate voltage to be applied to a gate terminal of each of the sixth switch and the fifth switch in the second capacitor circuit to cause conduction between the drain terminal and the source terminal of each of the sixth switch and the fifth switch or decreases a gradient of the value of the gate voltage in response to the detected voltage value of the second flying capacitor being less than or equal to a first voltage value and the alternating current power having a current value greater than a predetermined value.

9. The power converter according to claim 1, wherein the controller decreases a value of a gate voltage to be applied to a gate terminal of each of the seventh switch and the eighth switch in the second capacitor circuit to cause conduction between the drain terminal and the source terminal of each of the seventh switch and the eighth switch or decreases a gradient of the value of the gate voltage in response to the detected voltage value of the second flying capacitor being less than or equal to a first voltage value and the alternating current power having a current value less than or equal to a predetermined value.

10. A control method for a power converter, the power converter including a controller and a power conversion unit, the power conversion unit being configured to cause, based on a control command from the controller, conduction or opening between a drain terminal and a source terminal of each of a plurality of switches) and convert direct current power input into a first input terminal and a second input terminal to alternating current power to output the alternating current power from a first output terminal and a second output terminal, the power conversion unit including a direct current capacitor circuit including a first direct current capacitor and a second direct current capacitor connected in series between the first input terminal and the second input terminal, the first direct current capacitor having an end connected to the first input terminal, the second direct current capacitor having an end connected to the second input terminal, a first capacitor circuit including a first switch, a second switch, a third switch, and a fourth switch connected in series, the first capacitor circuit including a first flying capacitor having one end connected to a node between the source terminal of the first switch and the drain terminal of the second switch and another end connected to a node between the source terminal of the third switch and the drain terminal of the fourth switch, the first capacitor circuit including a node between the source terminal of the second switch and the drain terminal of the third switch connected to the second output terminal, a second capacitor circuit including a fifth switch, a sixth switch, a seventh switch, and an eighth switch connected in series, the second capacitor circuit including a second flying capacitor having one end connected to a node between the source terminal of the fifth switch and the drain terminal of the sixth switch and another end connected to a node between the source terminal of the seventh switch and the drain terminal of the eighth switch, the second capacitor circuit including a node between the source terminal of the sixth switch and the drain terminal of the seventh switch connected to the first output terminal, a first output circuit including a ninth switch, a tenth switch, an eleventh switch, and a twelfth switch connected in series between the first input terminal and the second input terminal, the ninth switch including the drain terminal connected to the first input terminal, the twelfth switch including the source terminal connected to the second input terminal, and a second output circuit including a thirteenth switch, a fourteenth switch, a fifteenth switch, and a sixteenth switch connected in series between the first input terminal and the second input terminal, the thirteenth switch including the drain terminal connected to the first input terminal, the sixteenth switch including the source terminal connected to the second input terminal, the first output circuit including a node between the source terminal of the ninth switch and the drain terminal of the tenth switch connected to the drain terminal of the first switch in the first capacitor circuit, a node between the source terminal of the eleventh switch and the drain terminal of the twelfth switch connected to the source terminal of the fourth switch in the first capacitor circuit, and a node between the source terminal of the tenth switch and the drain terminal of the eleventh switch connected to a node between the first direct current capacitor and the second direct current capacitor in the direct current capacitor circuit, the second output circuit including a node between the source terminal of the thirteenth switch and the drain terminal of the fourteenth switch connected to the drain terminal of the fifth switch in the second capacitor circuit, a node between the source terminal of the fifteenth switch and the drain terminal of the sixteenth switch connected to the source terminal of the eighth switch in the second capacitor circuit, and a node between the source terminal of the fourteenth switch and the drain terminal of the fifteenth switch connected to the node between the first direct current capacitor and the second direct current capacitor in the direct current capacitor circuit, the method comprising:

increasing or decreasing, with the controller, based on a detected voltage value of the first flying capacitor, a value of a gate voltage to be applied to a gate terminal of a target switch to be controlled selectively from the first switch, the second switch, the third switch, and the fourth switch in the first capacitor circuit to cause conduction between the drain terminal and the source terminal of the target switch, or changing, with the controller, a gradient of the value of the gate voltage based on the detected voltage value of the first flying capacitor; and increasing or decreasing, with the controller, based on a detected voltage value of the second flying capacitor, a value of a gate voltage to be applied to a gate terminal of a target switch to be controlled selectively from the fifth switch, the sixth switch, the seventh switch, and the eighth switch in the second capacitor circuit to cause conduction between the drain terminal and the source terminal of the target switch, or changing, with the controller, a gradient of the value of the gate voltage based on the detected voltage value of the second flying capacitor.

\* \* \* \* \*